United States Patent
Chiu et al.

(10) Patent No.: US 10,720,884 B2
(45) Date of Patent: Jul. 21, 2020

(54) HIGH SPEED QUANTUM EFFICIENCY SPECTRA OF MULTIJUNCTION CELLS USING MONOCHROMATOR-BASED HARDWARE

(71) Applicant: The Boeing Company, Chicago, IL (US)

(72) Inventors: Philip T. Chiu, La Crescenta, CA (US); Dimitri D. Krut, Encino, CA (US)

(73) Assignee: The Boeing Company, Chicago, IL (US)

( * ) Notice: Subject to any disclaimer, the term of this patent is extended or adjusted under 35 U.S.C. 154(b) by 221 days.

(21) Appl. No.: 15/810,037

(22) Filed: Nov. 11, 2017

(65) Prior Publication Data
US 2019/0149090 A1    May 16, 2019

(51) Int. Cl.
| | | |
|---|---|---|
| *H02S 50/15* | (2014.01) | |
| *H01L 31/076* | (2012.01) | |
| *G01J 3/18* | (2006.01) | |
| *H01L 31/0725* | (2012.01) | |
| *H01L 31/0687* | (2012.01) | |

(52) U.S. Cl.
CPC ............ *H02S 50/15* (2014.12); *G01J 3/18* (2013.01); *H01L 31/0687* (2013.01); *H01L 31/076* (2013.01); *H01L 31/0725* (2013.01)

(58) Field of Classification Search
None
See application file for complete search history.

(56) References Cited

U.S. PATENT DOCUMENTS

| | | | |
|---|---|---|---|
| 8,239,165 B1 * | 8/2012 | Young | ............ H02S 50/10 |
| | | | 702/182 |
| 2006/0048811 A1 | 3/2006 | Krut et al. | |
| 2010/0219327 A1 | 9/2010 | Arbore et al. | |
| (Continued) | | | |

FOREIGN PATENT DOCUMENTS

CN         101 710 171         5/2010

OTHER PUBLICATIONS

Tian Hanmin et al.; Universal AC measurement method for external quantum efficiency of solar battery; Published May 19, 2010; CN 101710171 A; Nanjing University; (Year: 2010).*

(Continued)

*Primary Examiner* — Nasima Monsur
(74) *Attorney, Agent, or Firm* — McDonnell Boehnen Hulbert & Berghoff LLP

(57) ABSTRACT

A quantum efficiency test controller (QETC) and related techniques for measuring quantum efficiency are described. The QETC performs one or more test iterations to obtain test results regarding quantum efficiency of a multijunction photovoltaic device (MPD) having a number N of photovoltaic junctions (N>0), where the QETC is associated with N bias light sources. During a test iteration, the QETC activates a grating monochromator to emit a first test probe of monochromatic light at a first wavelength; and while the grating monochromator is emitting the first test probe, iterates through and activates each of the N bias light sources to emit a corresponding bias band of wavelengths of light. After performing the test iteration(s), the QETC generates an output that is based on the test results related to the quantum efficiency of the MPD.

20 Claims, 14 Drawing Sheets

(56) References Cited

U.S. PATENT DOCUMENTS

2011/0246109 A1  10/2011  Fafard
2012/0010854 A1*  1/2012  Ciocan .................. G01N 21/31
  702/182
2015/0084664 A1*  3/2015  Schmidt .................. H02S 50/10
  324/761.01

OTHER PUBLICATIONS

Extended European Search Report prepared by the European Patent Office in application No. 18 20 5480.9 dated Feb. 25, 2019.
J. Burdick et al., "Spectral Response and I-V Measurements of Tandem Amorphous-Silicon Alloy Solar Cells", Solar Cells, Sep.-Oct. 1986, pp. 301-314, vol. 18, Issues 3-4.
F. Corrigan, "Multispectral Imaging Camera Drones in Farming Yield Big Benefits", May 29, 2017, DroneZon, available via the Internet at www.dronezon.com/learn-about-drones-quadcopters/multispectral-sensor-drones-in-farming-yield-big-benefits (last visited on Aug. 22, 2017).
Newport Corporation, "Photovoltaic Test Capabilities", 2009.
Wikimedia Foundation, "Monochromator", Apr. 1, 2017, available via the Internet at en.wikipedia.org/w/index.php?title=Monochromator&oldid=773359398 (last visited on Aug. 22, 2017).
Wikimedia Foundation, "Multispectral image", Jul. 3, 2017, available via the Internet at en.wikipedia.org/w/index.php?title=Multispectral_image&oldid=788844659 (last visited on Aug. 29, 2017).
Wikimedia Foundation, "Quantum efficiency", May 2, 2017, available via the Internet at en.wikipedia.org/w/index.php?title=Quantum_efficiency&oldid=778255319 (last visited on Aug. 22, 2017).
Wikimedia Foundation, "Thermophotovoltaic", Jul. 31, 2017, available via the Internet at en.wikipedia.org/w/index.php?title=Thermophotovoltaic&oldid=793300523 (last visited on Aug. 22, 2017).

* cited by examiner

100

110 Perform one or more test iterations to obtain test results related to a quantum efficiency of a multijunction photovoltaic device using a quantum efficiency test controller, the multijunction photovoltaic device including a number N of photovoltaic junctions, the number N being greater than zero, where the quantum efficiency test controller is associated with the number N of bias light sources, and where a test iteration comprises the quantum efficiency test controller:
- activating a grating monochromator to emit a first test probe of monochromatic light at a first wavelength, and
- while the grating monochromator is emitting the first test probe of monochromatic light, iterating through the number N of bias light sources to activate each of the number N of bias light sources to emit a corresponding bias band of wavelengths of light

120 After performing the one or more test iterations, generate an output of the quantum efficiency test controller, the output based on the test results related to the quantum efficiency of the multijunction photovoltaic device

FIG. 1

HIGH SPEED QUANTUM EFFICIENCY SPECTRA OF MULTIJUNCTION CELLS USING MONOCHROMATOR-BASED HARDWARE

FIELD

The present disclosure generally relates to testing of multijunction cells/devices, and more particularly, to determining quantum efficiency spectra for multijunction devices, including multijunction solar cells, using a monochromator.

BACKGROUND

Many photovoltaic devices, such as solar cells, have multiple junctions of semiconductor materials connected in series to produce electric current in response to receiving different wavelengths of light. Such photovoltaic devices are called multijunction photovoltaic devices (MPDs).

The use of multiple junctions can provide more efficient photovoltaic devices, but characterizing each junction's performance; e.g., determining an amount of current produced by each junction gives rise to additional challenges. One example method for characterizing performance multijunction photovoltaic devices is quantum efficiency (QE) spectroscopy. Quantum efficiency spectroscopy allows determination of a current for each junction of a multijunction photovoltaic device.

SUMMARY

In an example embodiment, a method is described. A quantum efficiency test controller performs one or more test iterations to obtain test results related to a quantum efficiency of a multijunction photovoltaic device. The multijunction photovoltaic device includes a number N of photovoltaic junctions with the number N being greater than zero. The quantum efficiency test controller is associated with the number N of bias light sources. A test iteration includes the quantum efficiency test controller: activating a grating monochromator to emit a first test probe of monochromatic light at a first wavelength; and while the grating monochromator is emitting the first test probe of monochromatic light, iterating through the number N of bias light sources to activate each of the number N of bias light sources to emit a corresponding bias band of wavelengths of light. After performing the one or more test iterations, the quantum efficiency test controller generates an output that is based on the test results related to the quantum efficiency of the multijunction photovoltaic device.

In another example embodiment, a system is described. The system includes: a grating monochromator; a number N of light sources, the number N being greater than zero; and a quantum efficiency test controller. The quantum efficiency test controller includes one or more processors and one or more non-transitory computer readable media. The one or more non-transitory computer readable media are configured to store at least computer-readable instructions that, when executed by the one or more processors, cause the quantum efficiency test controller to perform functions. The functions include: performing one or more test iterations to obtain test results related to a quantum efficiency of a multijunction photovoltaic device, the multijunction photovoltaic device including the number N of photovoltaic junctions, where a test iteration includes: activating a grating monochromator to emit a first test probe of monochromatic light at a first wavelength, and while the grating monochromator is emitting the first test probe of monochromatic light, iterating through the number N of bias light sources to activate each of the number N of bias light sources to emit a corresponding bias band of wavelengths of light; and after performing the one or more test iterations, generating an output that is based on the test results related to the quantum efficiency of the multijunction photovoltaic device.

In a further example embodiment, a non-transitory computer readable medium is described. The non-transitory computer readable medium has stored thereon computer-readable instructions that when executed by one or more processors of a quantum efficiency test controller, cause the quantum efficiency test controller to perform functions. The functions include: performing one or more test iterations to obtain test results related to a quantum efficiency of a multijunction photovoltaic device, the multijunction photovoltaic device including a number N of photovoltaic junctions, the number N being greater than zero, where the quantum efficiency test controller is associated with the number N of bias light sources, and where a test iteration includes: activating a grating monochromator to emit a first test probe of monochromatic light at a first wavelength, and while the grating monochromator is emitting the first test probe of monochromatic light, iterating through the number N of bias light sources to activate each of the number N of bias light sources to emit a corresponding bias band of wavelengths of light; and after performing the one or more test iterations, generating an output that is based on the test results related to the quantum efficiency of the multijunction photovoltaic device.

It should be understood that the description provided in this summary section and elsewhere in this document is intended to illustrate aspects of the present disclosure by way of non-limiting example. Generally, the features, functions, components, and advantages that are discussed herein can be achieved independently in various embodiments or may be combined in yet other embodiments, further details of which are disclosed in the following description and the accompanying drawings.

BRIEF DESCRIPTION OF THE FIGURES

FIG. 1 is a flowchart of a method, according to an example embodiment.

DETAILED DESCRIPTION

Figure 2:
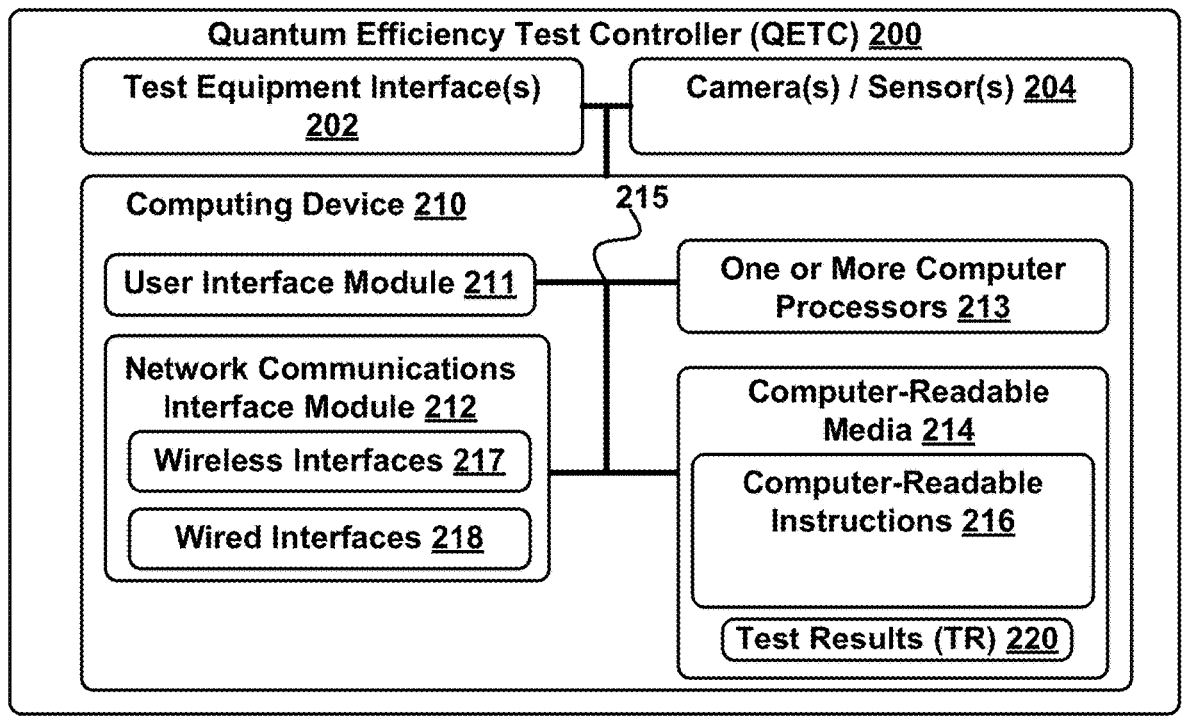
FIG. 2 is a block diagram of a quantum efficiency test controller, according to an example embodiment.

In a multijunction photovoltaic device, the current of the device and its efficiency are limited by the junction producing the lowest current. To maximize multijunction photovoltaic device current and efficiency, both the total current collected all junctions should be maximized and the total current should be balanced evenly amongst all junctions. One technique for characterizing for multijunction photovoltaic devices, such as devices used for high power space and terrestrial applications, is quantum efficiency spectroscopy. Quantum efficiency spectroscopy allows determination of individual junction currents in a multijunction photovoltaic device; determining the individual junction currents is closely related to optimizing device current and efficiency.

One technique used to measure and optimize junction currents of a multijunction photovoltaic device involves quantum efficiency spectroscopy. Quantum efficiency may be defined as a probability that an electron hole pair contributes to multijunction photovoltaic device current from a single photon with a specific wavelength. Quantum efficiency spectroscopy involves measuring quantum efficiency over a range of wavelengths and then integrating the quantum efficiency with respect to a spectrum having a known current/wavelength to obtain the junction current.

In the case of multijunction photovoltaic devices, application of one or more external bias lights allows selection of each junction of the device, and then the quantum efficiency is then measured to determine a current for each junction. Each junction of a multijunction photovoltaic device is typically activated by a particular wavelength of light to generate current—different wavelengths are selected for different junctions to increase a spectrum of light that activates the entire device. Then, a bias light can activate a junction by emitting a particular wavelength of light that activates the junction to emit current.

Quantum efficiency spectra of multijunction photovoltaic devices can be measured by one of at least two techniques. In a first technique of measuring quantum efficiency spectra, quantum efficiency of a junction under test of a multijunction photovoltaic device is measured, where a junction is selected for measurement by illuminating bias lights that activate each other junctions of the device, so that all junctions of the device but the junction under test are activated. Then, a grating monochromator is directed to scan through a number of wavelengths of light. During the scan, the grating monochromator separates out a "test probe" of monochromatic light, which is light having a narrow band of wavelengths; e.g., having a wavelength resolution, or range of wavelengths, of 25 nanometers (nm) or less. The grating monochromator can select light for one or more different test probes from a white light source. The test probe can probe or determine the response (e.g., quantum efficiency, reflectivity, emitted current) of the junction under test. After the response of the junction is measured, the grating monochromator continues with its scan of selecting test probes through some or all of wavelengths of light provided by the white light source. For each subsequent junction of the device, the light bias is changed to select the next junction, and another scan of the grating monochromator takes place.

However, mechanical motion of the grating monochromator is time consuming, requiring on the order of several minutes per scan. In the first technique, the number of scans is equal to the number of junctions of the multijunction photovoltaic device. Then, as the number of junctions in multijunction photovoltaic devices increases over time, so too does the time required for quantum efficiency measurements.

A second technique of measuring quantum efficiency spectra dispenses completely with grating monochromators. Rather, the second technique utilizes an array of LEDs with varying wavelengths is used, with each LED flashing at a specific frequency. Using Fourier transforms, the quantum efficiency for each LED wavelength can be determined on the order of seconds. However, wavelength resolution of this technique and therefore its inherent accuracy is limited by the number of available LEDs at specific wavelengths and their emission full width half maximum (FWHM). In the visible portion of the spectrum, LEDs are limited to a wavelength resolution of approximately 20 nm, and in the infrared portion of the spectrum, LED wavelength resolution is 50 nm or more.

While the second technique can produce quantum efficiency measurements quickly (on the order of seconds), the second technique may sacrifice measurement accuracy due to the relatively-large wavelength resolution—20 nm or more—associated with LED based measurements in comparison to the wavelength resolution of 5 nm (or less) of light emitted by the grating monochromator. As such, both the first and second techniques of measuring quantum efficiency have weaknesses—the first technique is relatively slow compared to the second technique, and the second technique is relatively inaccurate compared to the first technique.

Herein is described a new technique of measuring quantum efficiency that utilizes a grating monochromator while improving the speed of measurement by reducing the number of monochromator scans to one, rather than one scan per junction as used by the first technique. For an example of a triple junction multijunction photovoltaic device, the measurement time taken using the new technique is reduced by a factor of 3 over the first technique. Further, the herein-described new technique retains the superior measurement accuracy of a high wavelength resolution grating monochromator of the first technique, and therefore is superior to the second technique. In summary, the new technique described herein retains the advantages of the grating monochromator in terms of accuracy, while greatly increasing the speed of measurement; e.g., reducing the time to measure quantum efficiencies by a factor of three for a standard three-junction multijunction photovoltaic device.

FIG. 1 is a flowchart of method 100, according to an example embodiment. Method 100 is a method for measuring and generating output related to a quantum efficiency of a multijunction photovoltaic device. Method 100 is executable by a computing device acting as a quantum efficiency test controller (QETC), such as described at least in the context of FIG. 2.

Method 100 begins at block 110 of FIG. 1, where a quantum efficiency test controller performs one or more test iterations to obtain test results related to a quantum efficiency of a multijunction photovoltaic device, where the multijunction photovoltaic device includes a number N of photovoltaic junctions (N>0), where the quantum efficiency test controller is associated with the number N of bias light sources. Each test iteration includes the quantum efficiency test controller: activating a grating monochromator to emit a first test probe of monochromatic light at a first wavelength, and while the grating monochromator is emitting the first test probe of monochromatic light, iterating through the number N of bias light sources to activate each of the number N of bias light sources to emit a corresponding bias band of wavelengths of light, such as discussed in the context of at least FIGS. 2-8.

Figure 3:
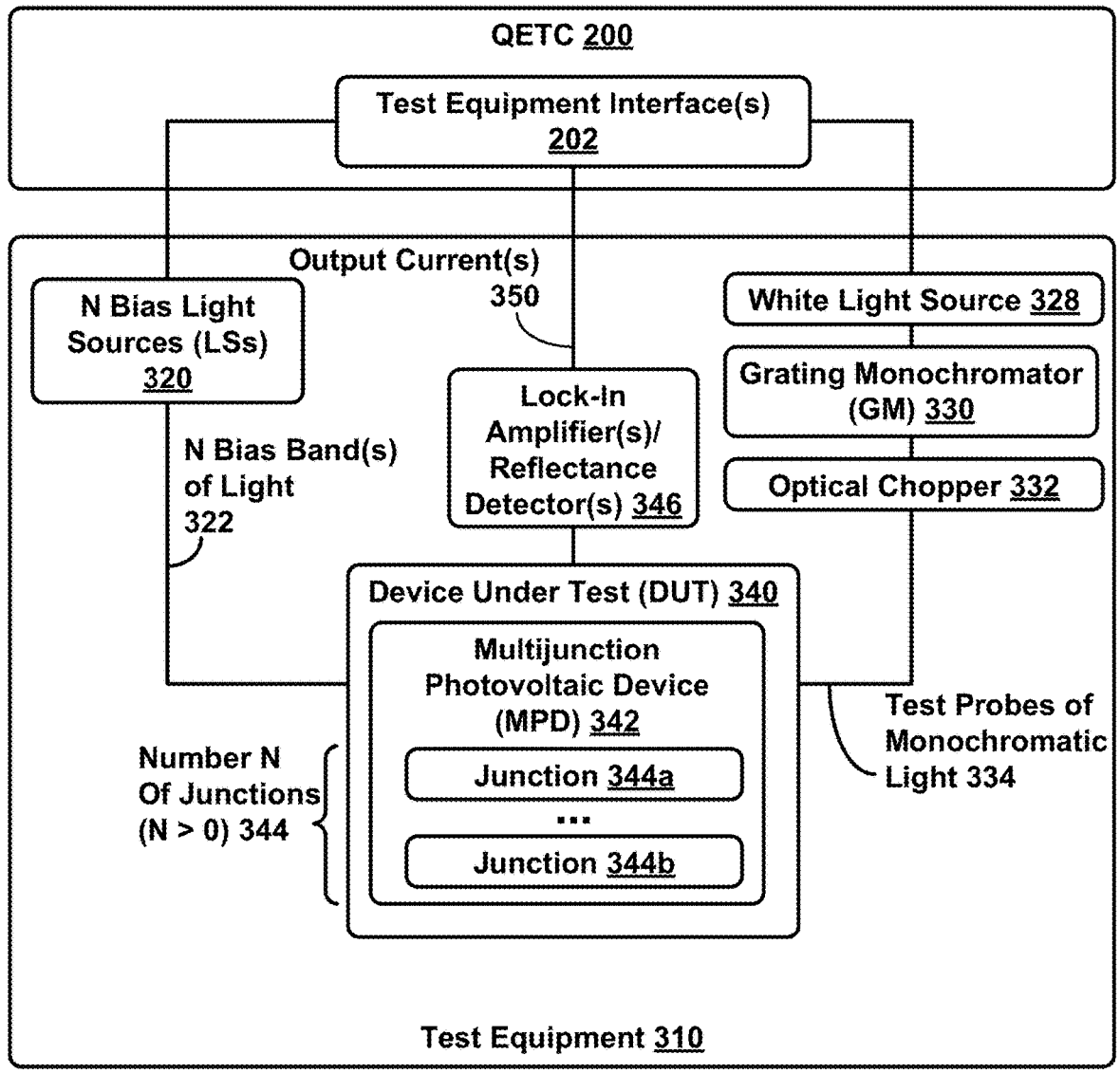
FIG. 3 is a block diagram of a system for testing quantum efficiency for a device under test, according to an example embodiment.

In some embodiments, activating the grating monochromator to emit the first test probe of monochromatic light includes activating the grating monochromator to emit the first test probe of monochromatic light having a resolution of 25 nanometers or less, such as discussed in the context of at least FIG. 3.

Figure 4:
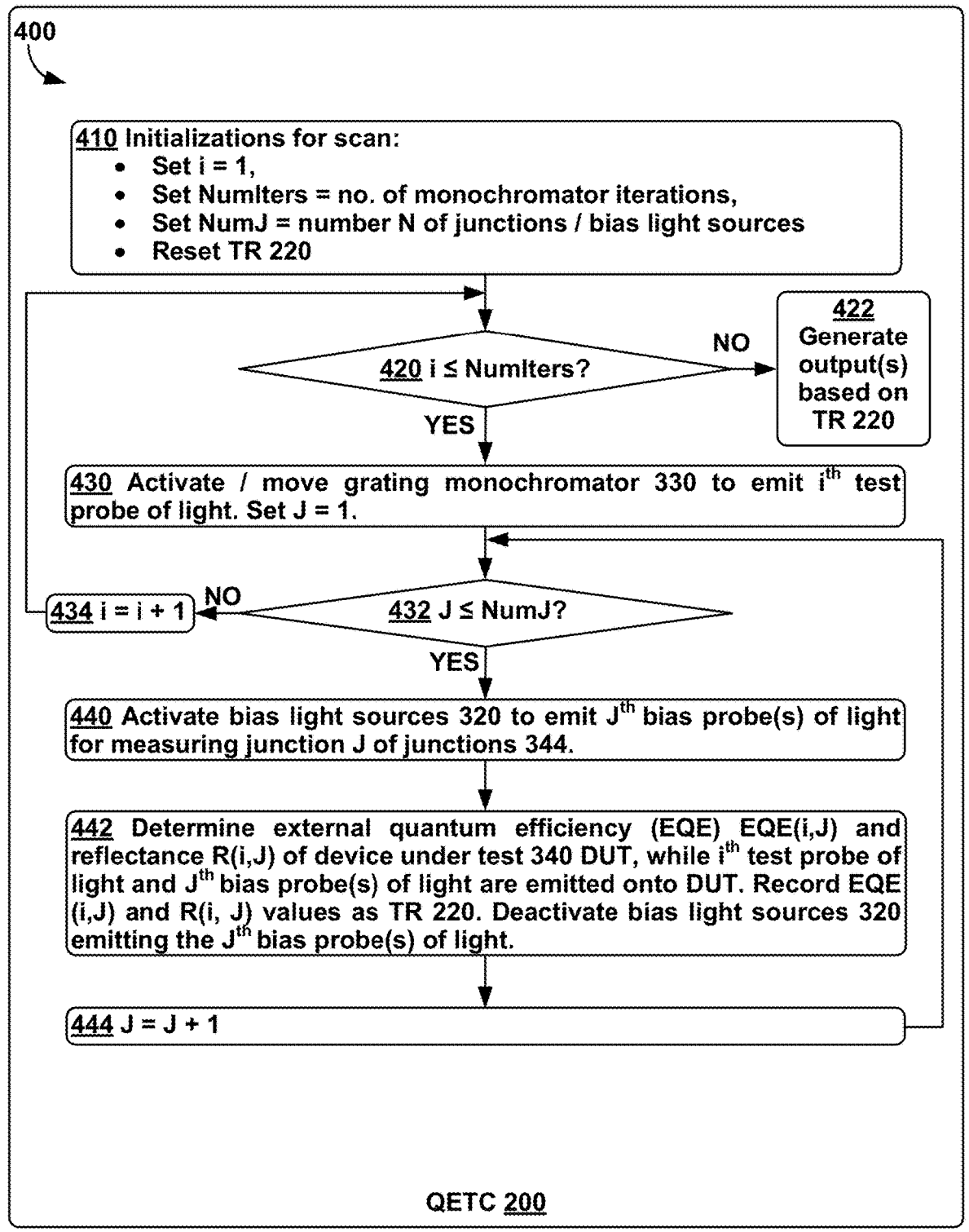
FIG. 4 is a flowchart of a method for determining quantum efficiency of a multijunction photovoltaic device using one scan of a grating monochromator, according to an example embodiment.

In other embodiments, iterating through the number N of bias light sources to activate each of the number N of bias light sources to emit the corresponding bias band of wavelengths of light includes activating one or more light emitting diodes (LEDs), such as discussed in the context of at least FIGS. 3 and 4. In some of these embodiments, the one or more LEDs includes a first LED and a second LED—then, activating the one or more LEDs includes: activating the first LED to emit a first bias band of wavelengths of light; and activating the second LED to emit a second bias band of wavelengths of light, such as discussed in the context of at least FIGS. 3 and 4. In other of these embodiments, the number N of bias light sources comprise a number N of LEDs—then, activating the one or more LEDs includes: activating the number N of LEDs in sequence to emit the number N bias bands of wavelengths of light, such as discussed in the context of at least FIGS. 3 and 4.

In even other embodiments, the number N is greater than one; then, iterating through the number N of bias light sources to activate each of the number N of bias light sources to emit a corresponding bias band of wavelengths of light includes: while the grating monochromator is emitting the first test probe of monochromatic light, measuring a quantum efficiency value for each of the number N of photovoltaic junctions; and recording the number N of measured quantum efficiency values as part of the test results, such as discussed in the context of at least FIGS. 4-8. In some of these embodiments, the number N of photovoltaic junctions includes a first photovoltaic junction and a second photovoltaic junction and the number N of bias light sources includes a first bias light source configured to emit a first bias band of wavelengths of light and a second bias light source configured to emit a second bias band of wavelengths of light; then, measuring the quantum efficiency value for each of the number N of photovoltaic junctions includes: measuring a first current generated by the first photovoltaic junction while the first test probe of monochromatic light and the first bias band of wavelengths of light are being emitted; determining a first quantum efficiency value of the first photovoltaic junction based on the measured first current; measuring a second current generated by the second photovoltaic junction while the first test probe (or band) of wavelengths of light and the second bias band of wavelengths of light are being emitted; and determining a second quantum efficiency value of the second photovoltaic junction based on the measured second current, such as discussed in the context of at least FIGS. 4-8. In other of these embodiments, measuring the quantum efficiency value for each of the number N of photovoltaic junctions can include: repeating, for each photovoltaic junction of the number N of photovoltaic junctions: measuring a current generated by the photovoltaic junction while first test probe of monochromatic light and a bias band of wavelengths of light associated with the photovoltaic junction are being emitted, and determining a quantum efficiency value of the photovoltaic junction based on the measured current, such as discussed in the context of at least FIGS. 4-8.

In still other embodiments, performing one or more test iterations includes performing a second test iteration, the second test iteration including: activating the grating monochromator to emit a second test probe of monochromatic light at a second wavelength, where the second wavelength differs from the first wavelength by at least a resolution of the monochromator is emitting the first test probe of monochromatic light; and while the grating monochromator is emitting the second test probe of monochromatic light, iterating through the number N of bias light sources to activate each of the number N of bias light sources to emit a corresponding bias band of wavelengths of light, such as discussed in the context of at least FIGS. 4-8.

In yet other embodiments, performing the one or more test iterations to obtain test results related to the quantum efficiency of the multijunction photovoltaic device includes performing the one or more test iterations to obtain test results related to the quantum efficiency of component of a solar cell, a laser power converter, and/or a thermal photovoltaic cell, such as discussed in the context of at least FIG. 3.

In further other embodiments, performing the one or more test iterations includes the one or more test iterations collectively causing the grating monochromator to make a single scan through a plurality of wavelengths of light, such as discussed in the context of at least FIGS. 4-8.

At block 120, the quantum efficiency test controller generates an output after performing the one or more test iterations, where the output is based on the test results related to the quantum efficiency of the multijunction photovoltaic device, such as discussed in the context of at least FIGS. 2-14.

Figure 9:
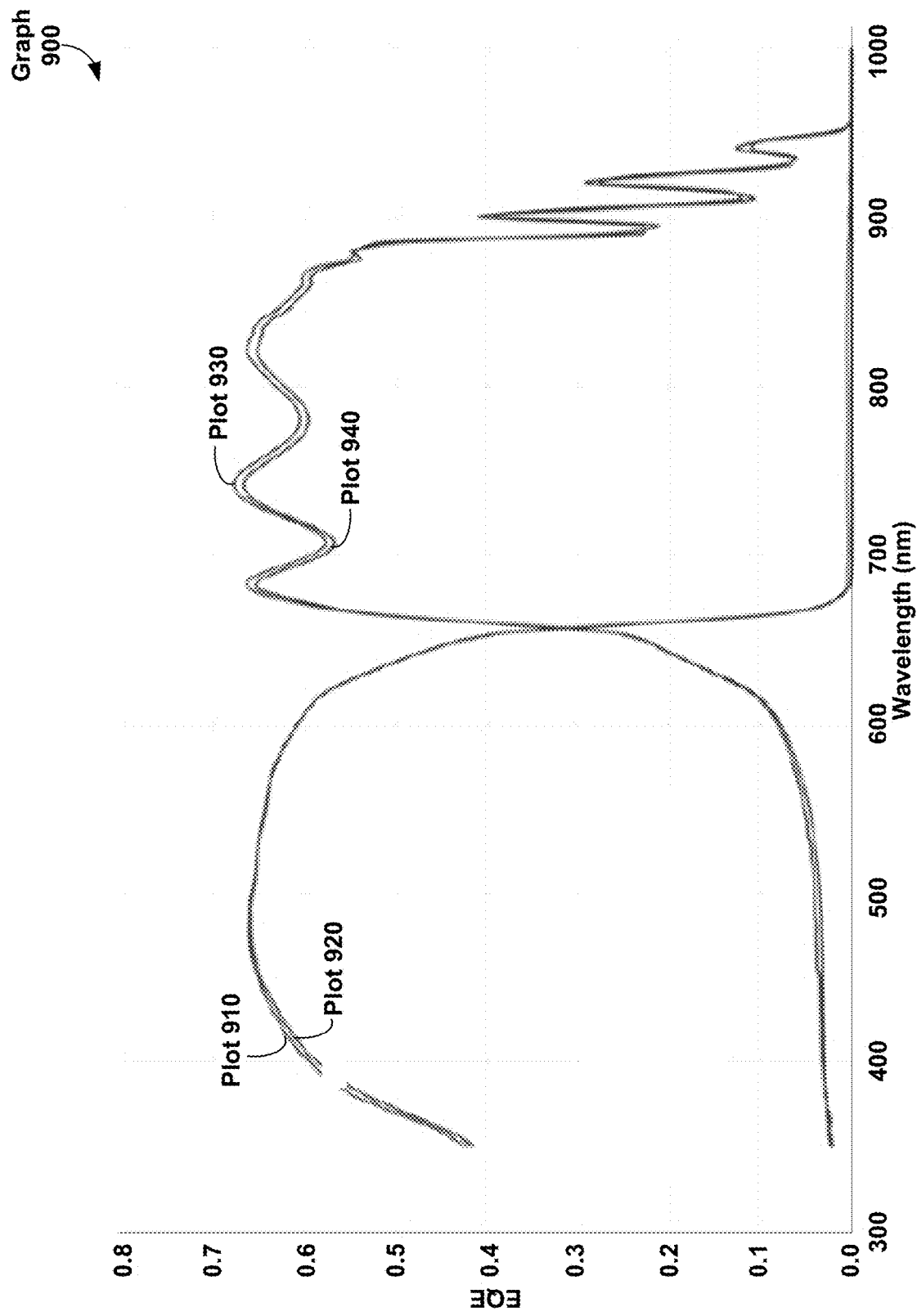
FIG. 9 shows a graph illustrating external quantum efficiency of a multijunction photovoltaic device of a technique that uses the method of FIG. 4 and another technique, according to an example embodiment.

In some embodiments, generating the output based on the test results related to the quantum efficiency of the multijunction photovoltaic device includes generating a graph of quantum efficiencies of the multijunction photovoltaic device over the plurality of wavelengths of light, such as discussed in the context of at least FIG. 9.

In other embodiments, the quantum efficiency test controller is part of a system that includes: a light source configured to provide a broadband white light to the grating monochromator; an optical chopper configured to interrupt light emitted by the grating monochromator; and a lock-in amplifier configured to filter a response of the multijunction photovoltaic device to at least one bias band of wavelengths of light, such as discussed in the context of at least FIG. 3.

FIG. 2 is a block diagram of a quantum efficiency test controller (QETC) 200, according to an example embodiment. Quantum efficiency test controller 200 includes one or more test equipment interfaces 202, one or more cameras and/or sensors 102, and computing device 210, where test equipment interface(s) 202 and camera(s)/sensor(s) 204 are connected to computing device 210.

Test equipment interface(s) 202 include software and/or hardware for connecting to and/or communicating with (i.e., interfacing with) test equipment, where the test equipment includes, but is not limited to, one or more bias light sources, one or more lock-in amplifiers, one or more devices under test, one or more white light sources, one or more grating monochromators, and one or more optical choppers. In some examples, test equipment interface(s) 202 enables computing device 210 to send commands, e.g., activation and deactivation commands, and receive data from the test equipment interfaced with using test equipment interface(s) 202.

Camera(s)/sensor(s) 204 can provide data to computing device 210 by capturing images and/or other visual information at least related to quantum efficiency testing conducted using test equipment interfaced via test equipment interface(s) 202. For example, camera(s)/sensor(s) 204 can include one or more cameras that provide still and/or video imagery within range of the camera(s).

Computing device 210 can include user interface module 211, network communication interface module 212, one or more computer processors 213, and one or more computer-readable media 214, all of which may be linked together via a system bus, network, or other connection mechanism 215, in accordance with an example embodiment. In particular, computing device 210 can be configured to perform one or more functions related to: quantum efficiency test controller 200, methods 100, 400, scenarios 500, 1200, graphs 900, 1000, 1100, and/or user interface 1210. In some embodiments, computing device 210 can be a mobile or non-mobile computing device, and can be embodied as one or more of: desktop computer, laptop or notebook computer, personal data assistant (PDA), mobile phone, smart phone, smart watch, embedded processor, and/or any similar device that is equipped with at least one processing unit capable of executing machine-language instructions that implement at least part of the herein-described techniques and methods, including but not limited to methods 100, 400 and scenarios 500, 1200.

User interface module 211 can receive input and/or provide output, perhaps to a user. User interface module 211 can be configured to send and/or receive data to and/or from user input from input device(s), such as a keyboard, a keypad, a touch screen, a touch pad, a computer mouse, a track ball, a joystick, a game controller, and/or other similar devices configured to receive user input from a user of computing device 210. User interface module 211 can include output display devices, which can include, but are not limited to, one or more: cathode ray tubes (CRTs), liquid crystal displays (LCDs), light emitting diodes (LEDs), displays using digital light processing (DLP) technology, printers, light bulbs, and/or other devices capable of displaying visual outputs (e.g., graphical, textual, and/or numerical information). User interface module 211 can also be configured with one or more devices to generate audible output(s), such as a speaker, speaker jack, audio output port, audio output device, earphones, and/or other similar devices configured to convey sound and/or audible information to a user of computing device 210.

Network communication interface module 212 can be configured to send and receive data over wireless interfaces 217 and/or wired interfaces 218 via a network. Wireless interface(s) 217 if present, can utilize an air interface, such as a Bluetooth®, ZigBee®, Wi-Fi™, and/or WiMAX™ interface to a data network, such as a wide area network (WAN), a local area network (LAN), one or more public data networks (e.g., the Internet), one or more private data networks, or any combination of public and private data networks. Wired interface(s) 218, if present, can comprise a wire, cable, fiber-optic link and/or similar physical connection to a data network, such as a WAN, a LAN, one or more public data networks, such as the Internet, one or more private data networks, or any combination of such networks.

In some embodiments, network communication interface module 212 provides reliable, secured, and/or authenticated communications. For each communication described herein, information for ensuring reliable communications (i.e., guaranteed message delivery) can be provided, perhaps as part of a message header and/or footer (e.g., packet/message sequencing information, encapsulation header(s) and/or footer(s), size/time information, and transmission verification information such as CRC and/or parity check values). Communications can be made secure (e.g., be encoded or encrypted) and/or decrypted/decoded using one or more cryptographic protocols and/or algorithms, such as, but not limited to, DES, AES, RSA, Diffie-Hellman, and/or DSA. Other cryptographic protocols and/or algorithms can be used as well as or in addition to those listed herein to secure (and then decrypt/decode) communications.

Computer processor(s) 213 can include one or more central processing units, computer processors, mobile processors, digital signal processors (DSPs), GPUs, microprocessors, computer chips, programmable processors, multi-core processors, and/or other processing units configured to execute machine-language instructions and process data. Computer processor(s) 213 can be configured to execute computer-readable program instructions 216 that are contained in computer-readable media 214 and/or other instructions as described herein.

Computer-readable media 214 can include one or more physical and/or non-transitory storage devices, such as read-only memory (ROM), random access memory (RAM), removable disk drives, hard drives, thumb drives, magnetic-tape memory, optical-disk memory, flash memory, volatile storage devices, non-volatile storage devices, and/or other storage devices. Generally, a storage device is hardware that is capable of storing information; for example, data, computer-readable program instructions, and/or other suitable information on a temporary basis and/or a permanent basis. Computer-readable media 214 can include one or more physical and/or non-transitory storage devices with at least enough combined storage capacity to contain computer-readable program instructions 216 and any associated/related data structures, including but not limited to, test results (TR) 220. In some embodiments, some or all of computer-readable media 214 can be removable, such as a removable hard drive, removable disk, or flash memory.

Computer-readable program instructions 216 and any data structures contained in computer-readable media 214 can include computer-readable program instructions executable by processor(s) 213 and any storage required, respectively, to perform at least part of herein-described scenarios and methods, including but not limited to methods 100, 400 and scenarios 500, 1200. Computer-readable program instructions 216 can include instructions that when executed by processor(s) 213 to cause quantum efficiency test controller 200, to perform functions, including but not limited to herein-described functionality of software, displays, interfaces, and/or user interfaces.

Computer-readable media 214 can store part or all of test results 220. Test results 220 can include data of measurements related to quantum efficiencies of one or more devices, such as one or more multijunction photovoltaic devices under test. The measurements related to quantum efficiencies can include, but are not limited to, one or more current measurements, one or more internal and/or external quantum efficiency measurements, and one or more reflectance measurements. In some examples, test results 220 can include graphs and/or other outputs related to the data of measurements related to quantum efficiencies.

In other examples, other components that shown in FIG. 1 can be part of computing device 210. Generally, embodiments can be implemented using any hardware device or system capable of running program code.

FIG. 3 is a block diagram of system 300 for testing quantum efficiency for a device under test (DUT) 340, according to an example embodiment. System 300 includes quantum efficiency test controller 200 and test equipment 310 which are connected using test equipment interfaces 202. Test equipment 310 includes N (N>0) bias light sources 320 for generating bias lighting, white light source 328 for generating white light, grating monochromator (GM) 330, optical chopper 332, device under test 340, and one or more lock-in amplifiers and/or one or more reflectance detectors 346. Device under test 340 includes multijunction photovoltaic device 342, which includes N junctions 344. N junctions 344 include junction 344a and junction 344b. For example, device under test 340 can be one or more of a solar cell, a laser power converter, a thermal photovoltaic cell, or another device that includes a multijunction photovoltaic device.

Bias light sources 320 include at least N distinct light sources that can be directed/activated to emit at least N distinct bands of wavelengths of light; e.g., emit light having a pre-determined wavelength resolution (e.g., a range of 10 nm, 50 nm, 100 nm, 133 nm) about a peak or dominant wavelength. One such example is an LED that can emit a band of red visible light whose wavelengths are in the range of 625±45 nm. Many other examples are possible as well. Bias light sources 320 can include one or more light emitting diodes (LEDs), lasers, colored light bulbs, and/or other light sources that can be directed/activated to emit distinct bands of wavelengths of light.

White light source 328 includes one or more light sources that can be activated/directed to emit white light; that is, a combination of wavelengths of visible light having equal intensities. Grating monochromator 330 includes one or more devices that can be activated/directed to emit a test probe of monochromatic light, which is light having a narrow band of wavelengths of light that can be selected from a wider range of wavelengths; e.g., white light emitted by white light source 328. In other examples, a test probe can have a wavelength resolution of 25 nanometers or less; e.g., a resolution of 1 nm, 5 nm, 10 nm, 12.5 nm, or another value less than or equal to 25 nm. In particular of these examples, a test probe emitted by the grating monochromator has a wavelength resolution of 5 nm or less.

Optical chopper 332 includes one or more devices that can be activated/directed to periodically interrupt a beam of light; e.g., a beam of light emitted by grating monochromator 330.

The number N of bias light sources 320 is equal to the number N of junctions 344. During testing, N bias light sources for bias lighting 320 can emit N different bias bands of light 322. A bias band of wavelengths of light (or bias band of light, for short) can be a range of wavelengths of light selected to activate a particular, corresponding junction of junctions 344 of device under test 340. For example, if junction 344a is activated to emit current upon reception of light with wavelengths in the range of 450-500 nm, then a bias band of light (emitted by a light source of bias light sources 320) for junction 344a can include light with wavelength that are (at least partially) in the range of 450-500 nm. Many other examples of bias bands of light are possible as well.

Also during testing, white light source 328 is directed to emit white light that is fed into grating monochromator 330. Grating monochromator 330 then selects a narrow band of the white light for emission as a test probe of monochromatic light. The emitted monochromatic light is modulated into an alternating signal by having optical chopper 332 periodically interrupt the emitted monochromatic light. The resulting chopped, monochromatic light, shown in FIG. 3 as one or more test probes of monochromatic light 334, is focused onto device under test 340.

At the same time, N−1 of the N bias light sources 320 are activated to generate N−1 different of the N bias bands of light 322. The N−1 bias bands of light are also focused onto device under test 340 to provide a direct light that selects a single junction of the N junctions 344 that has not been activated, and so the un-activated junction can react to one or more test probes of monochromatic light 334 emitted by grating monochromator 330 via optical chopper 332; e.g., by emitting current in response to test probe(s) of monochromatic light 334.

A direct current (DC) response of device under test 340 is filtered out by a lock-in amplifier of lock-in amplifier(s)/reflectance detector(s) 346. Lock-in amplifier(s)/reflectance detector(s) 346 also amplify the un-filtered alternating current (AC) response of device under test 340 to the alternating monochromatic light, and so generate output currents 350.

A combination of one or more lock-in amplifiers and one or more reflectance detectors of lock-in amplifier(s)/reflectance detector(s) 346 determine reflectance of device under test 340 at an angle off normal from a sample of light from device under test 340. For example, the reflectance can be determined using a reflectance detector of device under test 340 acting as a reference detector, and the combination of one or more lock-in amplifiers and one or more reflectance detectors of lock-in amplifier(s)/reflectance detector(s) 346 can determine the angle angle off normal and thereby determine reflectance of device under test 340.

Quantum efficiency test controller 200 receives data about output currents 350 and perhaps other data about device under test 340 via test equipment interfaces 202 and records the data as test results 220.

In an example, multijunction photovoltaic device 342 has N=3 junctions as junctions 344. Then, system 300 can include N=3 three bias light sources 320 that can emit three different bias bands of light 322. In this example, bias light sources 320 include: (1) a first bias light source that can be directed/activated to emit a first bias band of light that activates a first junction of junctions 344; (2) a second bias light source that can be directed/activated to emit a second bias band of light that activates a second junction of junctions 344; and (3) a third bias light source that can be directed/activated to emit a third bias band of light that activates a third junction of junctions 344. In some of these examples, each of junctions 344 is activated by a different bias band of light, and so the three bias light sources 320 are selected so each of the first, second, and third bias bands of light differ. Then, to test a particular junction J of the example three-junction multijunction photovoltaic device 342, two of the bias light sources are activated to emit bias bands of light that activate the two junctions not currently under test, so that only junction J is activated by light from the test probe.

In other examples, N=2 or N>3; e.g., N is an integer selected from the range of [2, 10]. For example, if N=5, then multijunction photovoltaic device 342 has five junctions, and bias light sources can emit five different bias bands of light, where each bias band of light to activates a corresponding junction. Then, to test a particular junction J of the example five-junction multijunction photovoltaic device 342, four of the bias light sources are activated to emit bias bands of light to activate the four junctions of the five-junction multijunction photovoltaic device 342 not currently under test, so that only junction J is activated by light from the test probe.

FIG. 4 is a flowchart of method 400 for determining quantum efficiency of a multijunction photovoltaic device using one scan of a grating monochromator, according to an example embodiment. Method 400 can be carried out by a quantum efficiency test controller, such as quantum efficiency test controller 200.

Method 400 illustrates an algorithm for fast quantum efficiency measurements. Rather than performing a grating monochromator scan for each junction of device under test 340, a single scan of grating monochromator 330 is conducted for all junctions of device under test 340. As grating monochromator 330 emits a test probe of monochromatic light, N bias light sources 320 are activated to emit N−1 bias bands of wavelengths of light activate all but a first junction of the device. For example, suppose that the N bias light sources 320 and the N junctions 344 are both numbered 1, 2 . . . N, and the N bias light sources 320 are arranged so that bias light source #1 can emit light in a first bias band of light that activates junction #1, bias light source #2 can emit light in a second bias band of light that activates junction #2, and so on to reach bias light source # N can emit light in an $N^{th}$ bias band that activates junction # N. Then, to activate all junctions but junction #1 (the first junctions), N bias light sources #2-# N can be activated to emit their respective bias bands of wavelengths. Thus, emission of the test probe of monochromatic light by grating monochromator 330 will cause a response only by junction #1, as all other junctions #2-# N are already activated. The response of junction #1 to the test probe of monochromatic light is measured and test results recorded from those measurements.

The bias light sources are looped through to enable taking of measurements for each of the N junctions; e.g., values of J are looped to enable measurements of junction # J (1<J<N)—to take measurements of junction # J, bias light sources #1 . . . # J−1 and # J+1 # N (that is, all bias light sources 320 but bias light source # J) are all activated so that emission of the test probe of monochromatic light by grating monochromator 330 will cause a response only by junction # J. Only after test results are recorded for all N junctions is grating monochromator 330 activated to emit the next test probe of monochromatic light.

The use of method 400 minimizes grating monochromator 330 activations to one scan per device under test. In examples when bias light sources 320 are embodied by LEDs, changes in bias light sources can occur in a few milliseconds. In contrast, a scan of grating monochromator 330 can take several minutes, so reducing the number of grating monochromator scans to one, which is the minimum number of scan required to measure device under test 340, minimizes the time required to obtain measurements and test results for device under test 340. In comparison to prior art algorithms that take one grating monochromator scan for each of N junctions (N>1), method 400 is N times faster than these prior art algorithms. Further, method 400 produces this N times speedup without changing hardware and without reducing measurement quality of the prior art algorithms.

Method 400 begins at block 410, where the quantum efficiency test controller initializes several values. In particular, a value i is initialized to 1, a value NumIters is initialized to a number of grating monochromator iterations per grating monochromator scan, and a value NumJ is set to the number N of junctions 344 and bias light sources 320.

The value i represents a current iteration number for grating monochromator 330. The value NumIters represents a number of different wavelengths of light produced during one scan of a grating monochromator. The value NumJ represents the number N of junctions and corresponding bias light sources.

For example, suppose that a grating monochromator is configured to scan through light whose frequency ranges from 380 nm to 750 nm (i.e., the visible light spectrum) in 5 nm increments. Then, one scan of the grating monochromator would involve emission of [(750−380)/5]+1=75 different frequencies of light; e.g., light emissions of wavelengths of 380 nm, 385 nm . . . 745 nm, and 750 nm. In this example, the value NumIters would be set to 75. During one scan of the grating monochromator, the value i would start at 1 (representing emission of light at 385 nm) and end at 75 (representing emission of light at 750 nm). Also, at block 410, the quantum efficiency test controller can initialize and/or reset test results 220; e.g., create and/or initialize one or more new records, files, and/or other data structures for recording test results 220.

At block 420, the quantum efficiency test controller determines whether the value i is less than or equal to the value NumIters. If i is less than or equal to NumIters, the quantum efficiency test controller can proceed to block 430. Otherwise, i is greater than NumIters, and the quantum efficiency test controller can proceed to block 422.

At block 422, the quantum efficiency test controller generates outputs based on test results 220; e.g., one or more graphs of quantum efficiencies of device under test 340 over a plurality of wavelengths of light generated by grating monochromator 330, output of one or more comparisons of test results 220 for device under test 340 with test results for a reference device. In some examples, method 400 can end after the procedures of block 422 are completed.

At block 430, the quantum efficiency test controller activates grating monochromator 330 to emit the $i^{th}$ test probe of monochromatic light. In some examples, activation of grating monochromator 330 can involve directing grating monochromator 330 to move one or more mechanisms to select the $i^{th}$ test probe of monochromatic light; e.g., select the test probe of monochromatic light from white light provided by white light source 328. Also, at block 430, the quantum efficiency test controller sets the value J equal to 1. The value J represents a current junction under test; e.g., if J=1, then junction #1 is being tested.

At block 432, the quantum efficiency test controller determines whether the value J is less than or equal to the value NumJ. If J is less than or equal to NumJ, the quantum efficiency test controller can proceed to block 440. Otherwise, J is greater than NumJ, and the quantum efficiency test controller can proceed to block 434.

At block 434, the quantum efficiency test controller increments the value i by 1 and then proceeds to block 420.

At block 440, the quantum efficiency test controller activates bias light sources 320 to emit the $J^{th}$ bias band(s) of light for taking measurements of the $J^{th}$ junction of device under test 340. To emit the $J^{th}$ bias band(s) of light, the N−1 of the N bias light sources other than bias light source # J are activated, thereby enabling a response from only the $J^{th}$ junction of device under test 340 to the $i^{th}$ test probe of monochromatic light.

At block 442, the quantum efficiency test controller determines external quantum efficiency (EQE) value EQE(i, J) and reflectance value R(i, J) of device under test 340 "DUT", while $i^{th}$ test probe of monochromatic light and $J^{th}$ bias band(s) of light are emitted onto device under test 340 DUT. The external quantum efficiency EQE(i, J) values are determined based on respective output current(s) 350 emitted generated by device under test 340 while i$^{th}$ test probe of monochromatic light and J$^{th}$ bias band(s) of light are being emitted. The reflectance R(i, J) values are based on light reflected by device under test 340 while i$^{th}$ test probe of monochromatic light and J$^{th}$ bias band(s) of light are being emitted. Then, the quantum efficiency test controller records the determined EQE (i, J) and R(i, J) values as part of test results 220. After recording the EQE(i, J) and R(i, J) values, the quantum efficiency test controller deactivate bias light sources 320 emitting the J$^{th}$ bias band(s) of light.

At block 444, the quantum efficiency test controller increments the value J by 1 and then proceeds to block 432.

FIGS. 5, 6, 7, and 8 collectively show information flows for scenario 500, where quantum efficiency of a multijunction photovoltaic device is determined using method 400, according to an example embodiment.

Scenario 500 shows an example use of method 400 using the components of system 300. At the onset of scenario 500, quantum efficiency test controller 200 initializes values and test results 220 as indicated by block 410 of method 400, where NumIters (the number of grating monochromator iterations) is set to 3 and NumJ (the number of junctions=the number of bias lights sources) is set to 2. Proceeding with method 400, quantum efficiency test controller 200 activates grating monochromator 330 to emit test probe #1 as indicated at block 430, and activates bias light source (LS) #2 514 of bias light sources 320 to emit bias band of light #1 (that activates junction #2 344*b*) as indicated at block 440. While bias band of light #1 is emitted, quantum efficiency test controller 200 measures external quantum efficiency and reflectance of junction #1 344*a* and records the measured external quantum efficiency as EQE(1,1) and the measured reflectance as R(1,1) in test results 220, as indicated at block 442. As also indicated at block 442, quantum efficiency test controller 200 then deactivates light source #2 514 to stop emission of bias band #1. Quantum efficiency test controller 200 then increments the value J to be equal to 2, as indicated at block 444 and then proceeds to block 440 via block 432. Upon reaching block 440, quantum efficiency test controller 200 activates bias light source (LS) #1 512 of bias light sources 320 to emit bias band of light #2 (that activates junction #1 344*a*).

While bias band of light #2 is emitted, quantum efficiency test controller 200 measures external quantum efficiency and reflectance of junction #2 344*b* and records the measured external quantum efficiency as EQE(1,2) and the measured reflectance as R(1,2) in test results 220, as indicated at block 442. As also indicated at block 442, quantum efficiency test controller 200 then deactivates light source #1 512 to stop emission of bias band #2. Quantum efficiency test controller 200 proceeds to block 444 and increments the value J to be 3, proceeds to block 432 to determine that J is greater than NumJ. Quantum efficiency test controller 200 then proceeds to block 434, increments the value i to be 2, and further proceeds to block 420 as the completion of iteration #1 of grating monochromator 330.

Scenario 500 continues with quantum efficiency test controller 200 continuing with two more iterations—iterations #2 and #3—of grating monochromator 330. Upon completion of iteration #3, a scan of grating monochromator 330 is complete. After the scan is complete, quantum efficiency test controller 200 reaches block 422 of method 400 and generates an output graph of external quantum efficiency values based on the data in test results 220. After the output graph is generated, scenario 500 ends.

Figure 5:
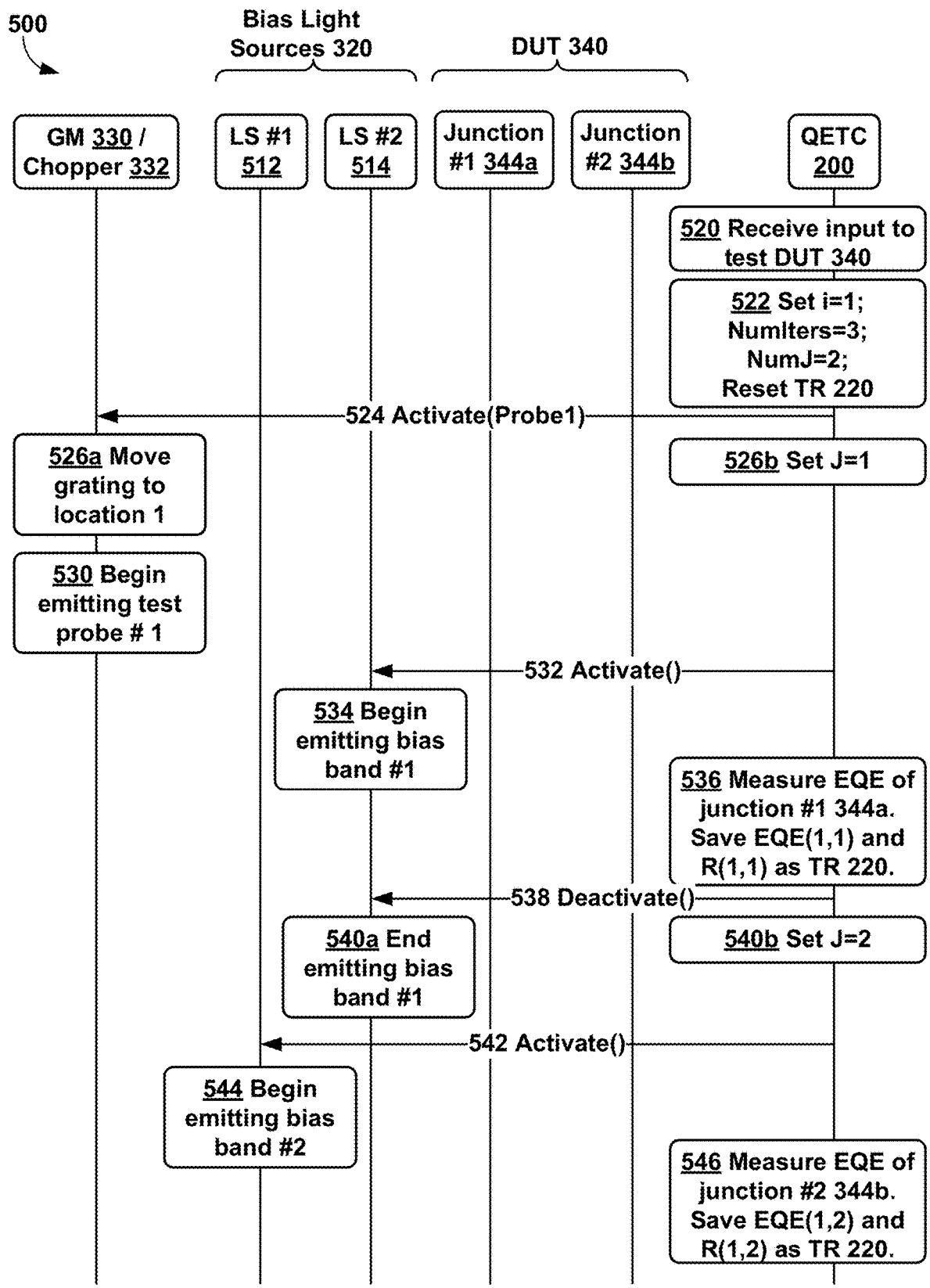
FIGS. 5, 6, 7, and 8 collectively show information flows for a scenario for determining quantum efficiency of a multijunction photovoltaic device using the method of FIG. 4, according to an example embodiment.

FIG. 5 shows that scenario 500 includes the use of grating monochromator 330, optical chopper 332, bias light sources 320, device under test 340, and quantum efficiency test controller 200, where bias light sources 320 include light source #1 512 and light source #2 514, and where device under test 340 includes multijunction photovoltaic device 342 having junction #1 344*a* and junction #2 344*b*. In scenario 500, light emitted by light source #1 512 activates junction #1 344*a* and light emitted by light source #2 514 activates junction #2 344*b*. Thus, in scenario 500, light source #1 512 emits bias band of light #2 to enable measurements of junction #2 344*b* using test probes of light emitted by grating monochromator 330, and light source #2 514 emits bias band of light #1 to enable measurements of junction #1 344*a* using test probes of light emitted by grating monochromator 330.

Scenario 500 begins at block 520, where quantum efficiency test controller 200 receives an input instructing quantum efficiency test controller 200 to begin testing of device under test 340. At block 522, quantum efficiency test controller 200 begins execution of software embodying method 400 starting with block 410, sets a value i equal to 1, sets a value NumIters equal to 3, sets a value NumJ equal to 2, and resets test results 220. The values i, NumIters, and NumJ are discussed above in the context of block 410 of method 400 shown in FIG. 4.

Quantum efficiency test controller 200 then proceeds to block 420 of method 400 and determines that the value i (equal to 1) is less than or equal to the value of NumIters (equal to 3), leading quantum efficiency test controller 200 to proceed to block 430 of method 400. FIG. 5 shows that quantum efficiency test controller 200 then sends Activate message 524 to direct grating monochromator 330 and optical chopper 332 to emit "Probe1" or test probe #1 of light. Upon reception of Activate message 524, grating monochromator 330 moves a grating to location 1, which corresponds to test probe #1, as indicated by block 526*a*, and begins to emit test probe #1, as indicated by block 530. At this time, quantum efficiency test controller 200 continues with block 430 of method 400 and sets a value J equal to 1, as indicated by block 526*b*. The value J is discussed above in the context of block 430.

Scenario 500 continues with quantum efficiency test controller 200 proceeding to block 432 of method 400 and determining that the value J (equal to 1) is less than or equal to the value NumJ (equal to 2), and so proceeds to block 440 of method 400. Quantum efficiency test controller 200 then sends Activate message 532 to direct light source #2 514 to emit bias band #1 of light. Upon reception of Activate message 532, light source #2 514 begins emitting bias band #1 of light as shown by block 534 of FIG. 5.

Quantum efficiency test controller 200 then proceeds to block 442 of method 400 to measure external quantum efficiency and reflectance of junction #1 while test probe #1 and bias band #1 of light are being emitted, and then save the measured external quantum efficiency and reflective values as respective values EQE(1, 1) and R(1, 1) as part of test results 220, as indicated by block 536 of FIG. 5. Quantum efficiency test controller 200 continues executing block 442 of method 400 and sends Deactivate message 538 to direct light source #2 514 to stop emitting bias band #1 of light. Upon reception of Deactivate message 538, light source #2 514 stops emitting bias band #1 of light, as indicated by block 540*a*. At the same time, quantum efficiency test controller 200 executes block 444 of method 400, and increments the value J to be 2, as indicated by block 540*b* of FIG. 5.

Scenario 500 proceeds with quantum efficiency test controller 200 proceeding to block 432 of method 400 and determining that the value J (equal to 2) is less than or equal to the value NumJ (equal to 2), and so proceeds to block 440 of method 400. Quantum efficiency test controller 200 then sends Activate message 542 to direct light source #1 512 to emit bias band #2 of light. Upon reception of Activate message 542, light source #1 512 begins emitting bias band #2 of light as shown by block 544 of FIG. 5.

Quantum efficiency test controller 200 then proceeds to block 442 of method 400 to measure external quantum efficiency and reflectance of junction #2 while test probe #1 and bias band #2 of light are being emitted, and then save the measured external quantum efficiency and reflective values as respective values EQE(1, 2) and R(1, 2) as part of test results 220, as indicated by block 546 of FIG. 5.

Figure 6:
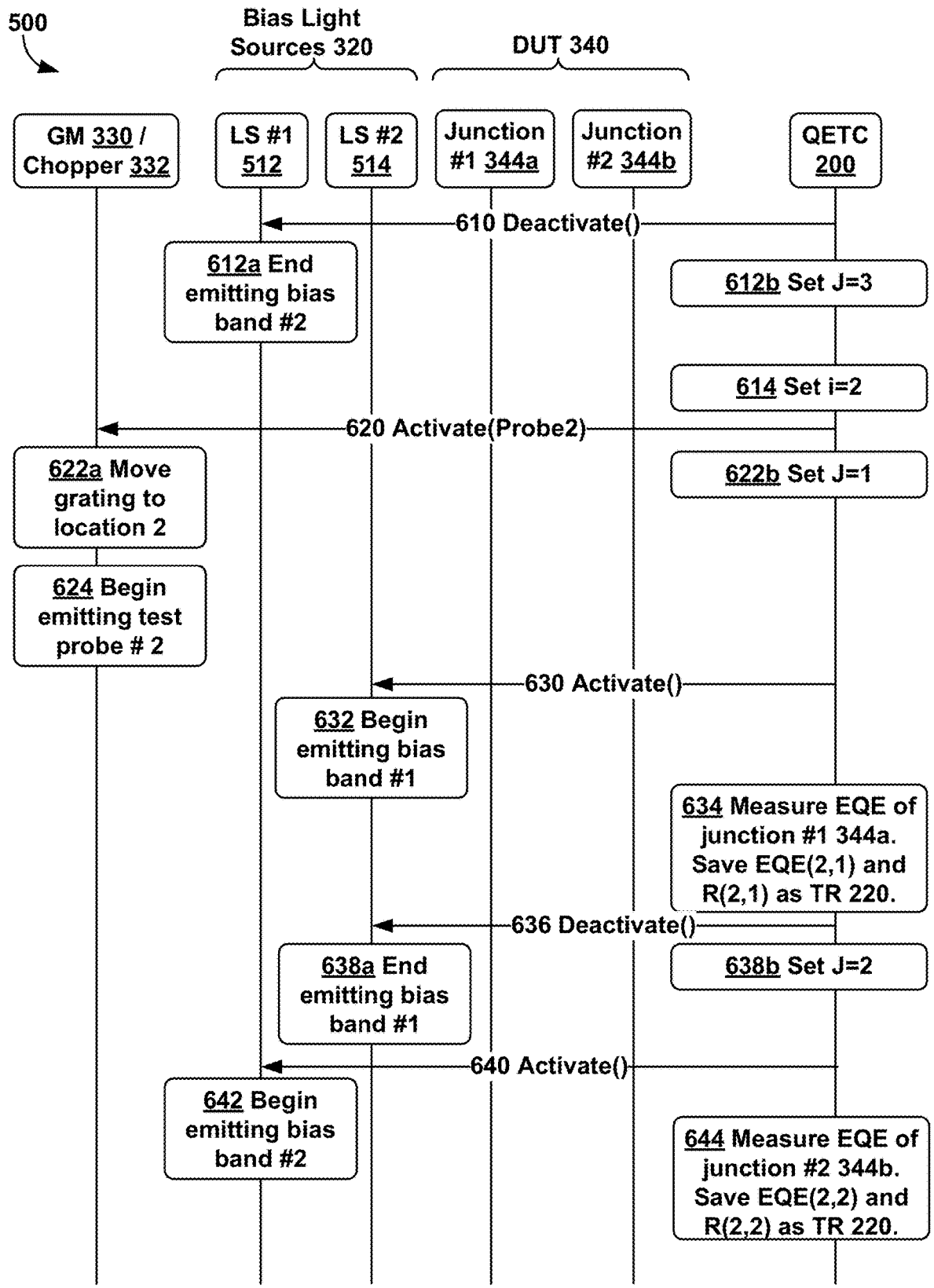

Quantum efficiency test controller 200 continues executing block 442 of method 400 and sends Deactivate message 610 of FIG. 6 to direct light source #1 512 to stop emitting bias band #2 of light. Upon reception of Deactivate message 610, light source #1 512 stops emitting bias band #2 of light, as indicated by block 612a. At the same time, quantum efficiency test controller 200 executes block 444 of method 400, and increments the value J to be 3, as indicated by block 612b of FIG. 6.

Scenario 500 continues with quantum efficiency test controller 200 proceeding to block 432 of method 400 and determining that the value J (equal to 3) is greater than the value NumJ (equal to 2), and so proceeds to block 434 of method 400. Quantum efficiency test controller 200 then increments the value i to be equal to 2 as indicated by block 614 of FIG. 6. Quantum efficiency test controller proceeds to block 420 of method 400 and determines that the value i (equal to 2) is less than or equal to the value of NumIters (equal to 3), leading quantum efficiency test controller 200 to proceed to block 430 of method 400.

Quantum efficiency test controller 200 then sends Activate message 620 to direct grating monochromator 330 and optical chopper 332 to emit "Probe2" or test probe #2 of light. Upon reception of Activate message 620, grating monochromator 330 moves a grating to location 2, which corresponds to test probe #2, as indicated by block 622a, and begins to emit test probe #2, as indicated by block 624. At this time, quantum efficiency test controller 200 continues with block 430 of method 400 and sets a value J equal to 1, as indicated by block 622b.

Scenario 500 continues with quantum efficiency test controller 200 proceeding to block 432 of method 400 and determining that the value J (equal to 1) is less than or equal to the value NumJ (equal to 2), and so proceeds to block 440 of method 400. Quantum efficiency test controller 200 then sends Activate message 630 to direct light source #2 514 to emit bias band #1 of light. Upon reception of Activate message 630, light source #2 514 begins emitting bias band #1 of light as shown by block 632 of FIG. 6.

Quantum efficiency test controller 200 then proceeds to block 442 of method 400 to measure external quantum efficiency and reflectance of junction #1 while test probe #2 and bias band #1 of light are being emitted, and then save the measured external quantum efficiency and reflective values as respective values EQE(2, 1) and R(2, 1) as part of test results 220, as indicated by block 634 of FIG. 6. Quantum efficiency test controller 200 continues executing block 442 of method 400 and sends Deactivate message 636 to direct light source #2 514 to stop emitting bias band #1 of light. Upon reception of Deactivate message 636, light source #2 514 stops emitting bias band #1 of light, as indicated by block 638a. At the same time, quantum efficiency test controller 200 executes block 444 of method 400, and increments the value J to be 2, as indicated by block 638b of FIG. 6.

Scenario 500 proceeds with quantum efficiency test controller 200 proceeding to block 432 of method 400 and determining that the value J (equal to 2) is less than or equal to the value NumJ (equal to 2), and so proceeds to block 440 of method 400. Quantum efficiency test controller 200 then sends Activate message 640 to direct light source #1 512 to emit bias band #2 of light. Upon reception of Activate message 640, light source #1 512 begins emitting bias band #2 of light as shown by block 642 of FIG. 6.

Quantum efficiency test controller 200 then proceeds to block 442 of method 400 to measure external quantum efficiency and reflectance of junction #2 while test probe #2 and bias band #2 of light are being emitted, and then save the measured external quantum efficiency and reflective values as respective values EQE(2, 2) and R(2, 2) as part of test results 220, as indicated by block 644 of FIG. 6.

Figure 7:
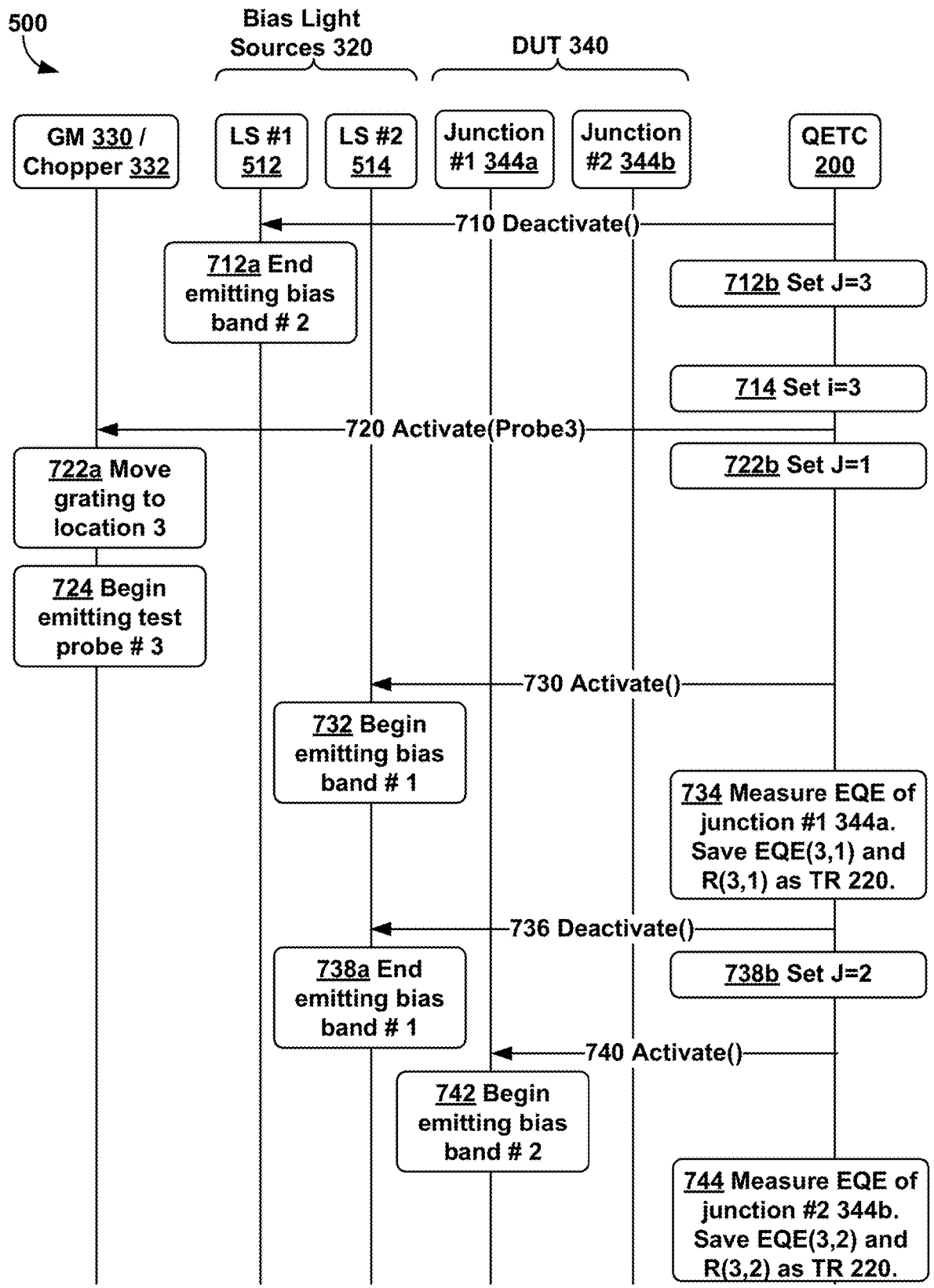

Quantum efficiency test controller 200 continues executing block 442 of method 400 and sends Deactivate message 710 of FIG. 7 to direct light source #1 512 to stop emitting bias band #2 of light. Upon reception of Deactivate message 710, light source #1 512 stops emitting bias band #2 of light, as indicated by block 712a. At the same time, quantum efficiency test controller 200 executes block 444 of method 400, and increments the value J to be 3, as indicated by block 712b of FIG. 7.

Scenario 500 continues with quantum efficiency test controller 200 proceeding to block 432 of method 400 and determining that the value J (equal to 3) is greater than the value NumJ (equal to 2), and so proceeds to block 434 of method 400. Quantum efficiency test controller 200 then increments the value i to be equal to 3 as indicated by block 714 of FIG. 7. Quantum efficiency test controller proceeds to block 420 of method 400 and determines that the value i (equal to 3) is less than or equal to the value of NumIters (equal to 3), leading quantum efficiency test controller 200 to proceed to block 430 of method 400.

Quantum efficiency test controller 200 then sends Activate message 720 to direct grating monochromator 330 and optical chopper 332 to emit "Probe3" or test probe #3 of light. Upon reception of Activate message 720, grating monochromator 330 moves a grating to location 3, which corresponds to test probe #3, as indicated by block 722a, and begins to emit test probe #3, as indicated by block 724. At this time, quantum efficiency test controller 200 continues with block 430 of method 400 and sets a value J equal to 1, as indicated by block 722b.

Scenario 500 continues with quantum efficiency test controller 200 proceeding to block 432 of method 400 and determining that the value J (equal to 1) is less than or equal to the value NumJ (equal to 2), and so proceeds to block 440 of method 400. Quantum efficiency test controller 200 then sends Activate message 730 to direct light source #2 514 to emit bias band #1 of light. Upon reception of Activate message 730, light source #2 514 begins emitting bias band #1 of light as shown by block 732 of FIG. 7.

Quantum efficiency test controller 200 then proceeds to block 442 of method 400 to measure external quantum efficiency and reflectance of junction #1 while test probe #3 and bias band #1 of light are being emitted, and then save the measured external quantum efficiency and reflective values as respective values EQE(3, 1) and R(3, 1) as part of test results 220, as indicated by block 734 of FIG. 7. Quantum efficiency test controller 200 continues executing block 442 of method 400 and sends Deactivate message 736 to direct light source #2 514 to stop emitting bias band #1 of light. Upon reception of Deactivate message 736, light source #2 514 stops emitting bias band #1 of light, as indicated by block 738*a*. At the same time, quantum efficiency test controller 200 executes block 444 of method 400, and increments the value J to be 2, as indicated by block 738*b* of FIG. 7.

Scenario 500 proceeds with quantum efficiency test controller 200 proceeding to block 432 of method 400 and determining that the value J (equal to 2) is less than or equal to the value NumJ (equal to 2), and so proceeds to block 440 of method 400. Quantum efficiency test controller 200 then sends Activate message 740 to direct light source #1 512 to emit bias band #2 of light. Upon reception of Activate message 740, light source #1 512 begins emitting bias band #2 of light as shown by block 742 of FIG. 7.

Quantum efficiency test controller 200 then proceeds to block 442 of method 400 to measure external quantum efficiency and reflectance of junction #2 while test probe #3 and bias band #2 of light are being emitted, and then save the measured external quantum efficiency and reflective values as respective values EQE(3, 2) and R(3, 2) as part of test results 220, as indicated by block 744 of FIG. 7.

Figure 8:
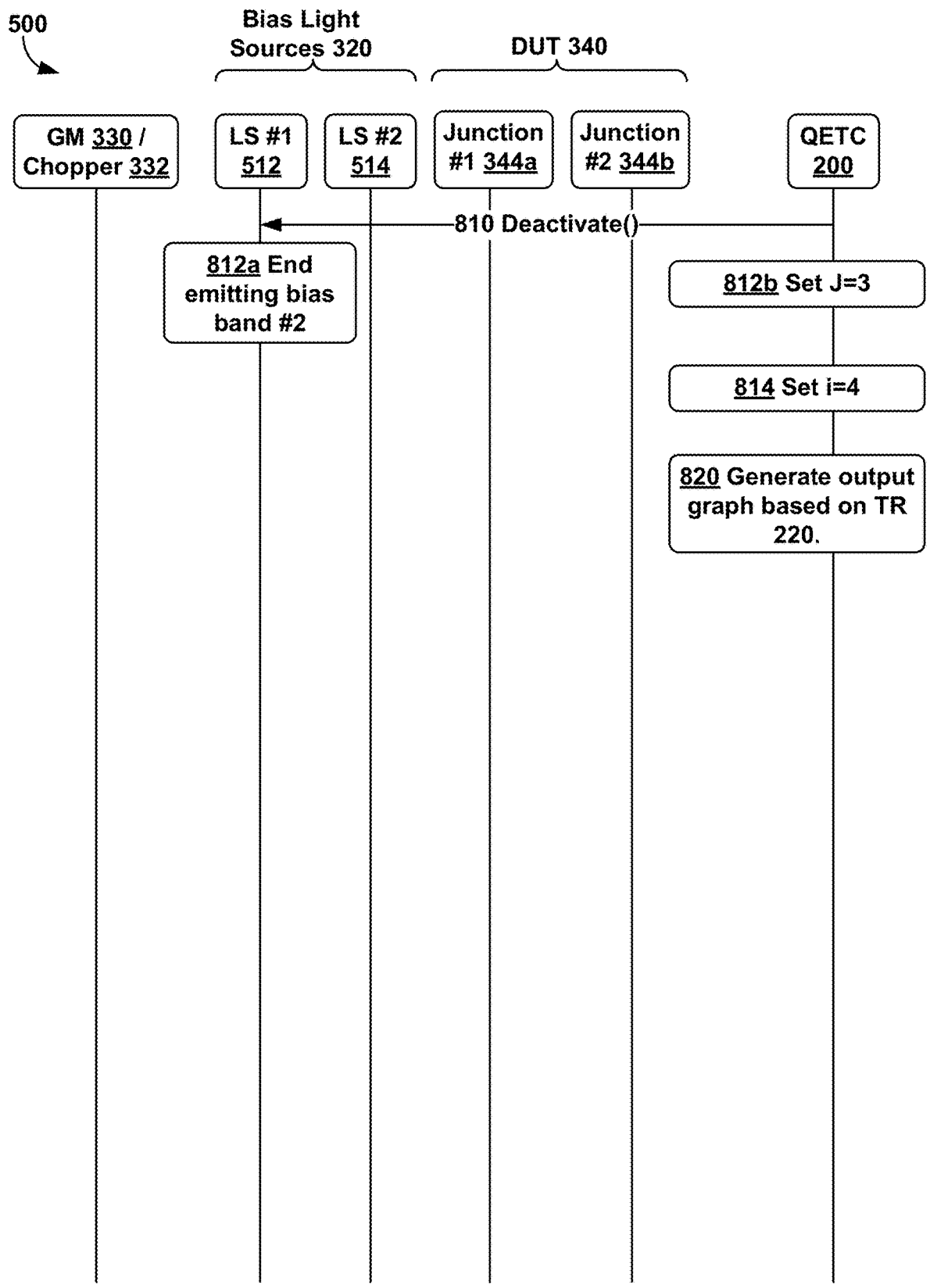

Quantum efficiency test controller 200 continues executing block 442 of method 400 and sends Deactivate message 810 of FIG. 8 to direct light source #1 512 to stop emitting bias band #2 of light. Upon reception of Deactivate message 810, light source #1 512 stops emitting bias band #2 of light, as indicated by block 812*a* of FIG. 8. At the same time, quantum efficiency test controller 200 executes block 444 of method 400, and increments the value J to be 3, as indicated by block 812*b*.

Scenario 500 continues with quantum efficiency test controller 200 proceeding to block 432 of method 400 and determining that the value J (equal to 3) is greater than the value NumJ (equal to 2), and so proceeds to block 434 of method 400. Quantum efficiency test controller 200 then increments the value i to be equal to 4 as indicated by block 814 of FIG. 8. Quantum efficiency test controller proceeds to block 420 of method 400 and determines that the value i (equal to 4) is greater than the value of NumIters (equal to 3), leading quantum efficiency test controller 200 to proceed to block 422 of method 400.

As indicated by block 820 of FIG. 8, quantum efficiency test controller 200 generates an output based on test results 220. In other scenarios, after generating the output based on test results 220, quantum efficiency test controller 200 deactivates one or more of: while light source 328, grating monochromator 330, and optical chopper 332.

In scenario 500, the output is a graph of external quantum efficiency values based on the data in test results 220. After the output graph is generated, both the procedures of block 820 and scenario 500 are completed.

FIG. 9 shows graph 900 illustrating external quantum efficiency of a multijunction photovoltaic device determined a technique that uses method 400 and the above-described first technique, according to an example embodiment. Graph 900 includes plots 910, 920, 930, and 940. Plot 910 shows a quantum efficiency spectrum of a first junction of a three-junction multijunction photovoltaic device, where the data depicted by plot 910 was obtained using a prior art technique involving multiple scans of a grating monochromator. Plot 920 shows a quantum efficiency spectrum of the same first junction of the same three-junction multijunction photovoltaic device measured for plot 910. However, the data depicted using plot 920 was obtained using method 400 and one scan of a grating monochromator.

Plot 930 shows a quantum efficiency spectrum of a second junction of a three-junction multijunction photovoltaic device, where the data depicted by plot 930 was obtained using a prior art technique involving multiple scans of a grating monochromator. Plot 940 shows a quantum efficiency spectrum of the same second junction of the same three junction multijunction photovoltaic device measured for plot 930. However, the data depicted using plot 940 was obtained using method 400 and one scan of a grating monochromator.

Figure 10:
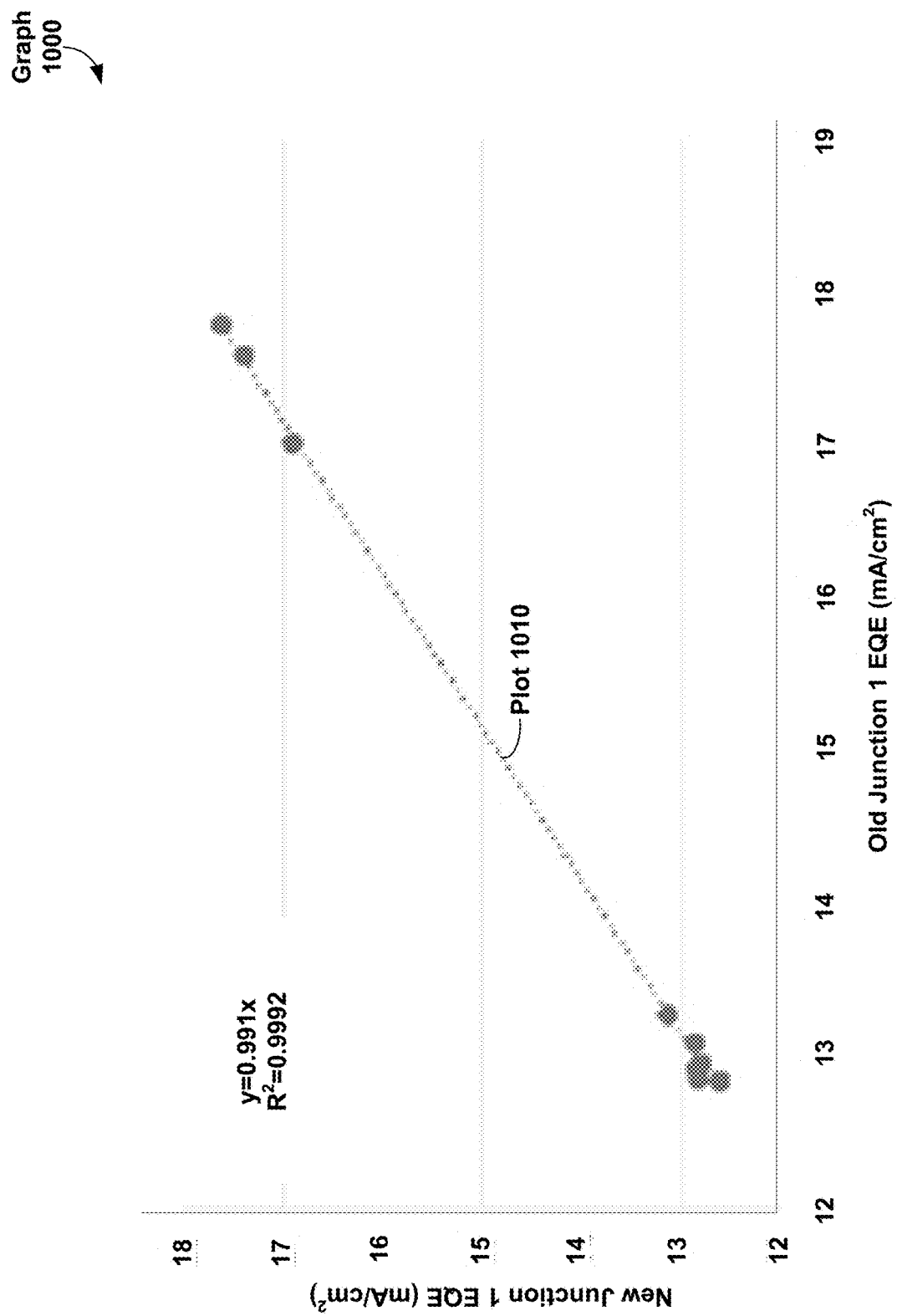
FIG. 10 shows a graph comparing the external quantum efficiencies determined by the two techniques whose external quantum efficiencies were plotted by the graph of FIG. 9, according to an example embodiment.

Plots 920 and 940 demonstrate that there is no degradation in measurement quality using method 400 in comparison to corresponding plots 910 and 930 obtained using a prior art technique. In particular graph 900 shows almost no difference between the prior-art plot 910 and the method-400 plot 920 indicating similar quality in measurement for the first junction. Graph 900 also shows almost no difference between the prior-art plot 930 and the method-400 plot 940 indicating similar quality in measurement for the second junction FIG. 10 shows graph 1000 including plot 1010 comparing data of respective plots 910 and 920 of external quantum efficiencies determined for the first junction of the three-junction multijunction photovoltaic device discussed above in the context of FIG. 9, according to an example embodiment. Graph 1000 also shows that data of respective plots 910 and 920 have an $R^2$ value of 0.9992, indicating near equivalence of measurement quality between the prior art algorithm used to generate the data for plot 910 and method 400 used to generate the data for plot 920.

Figure 11:
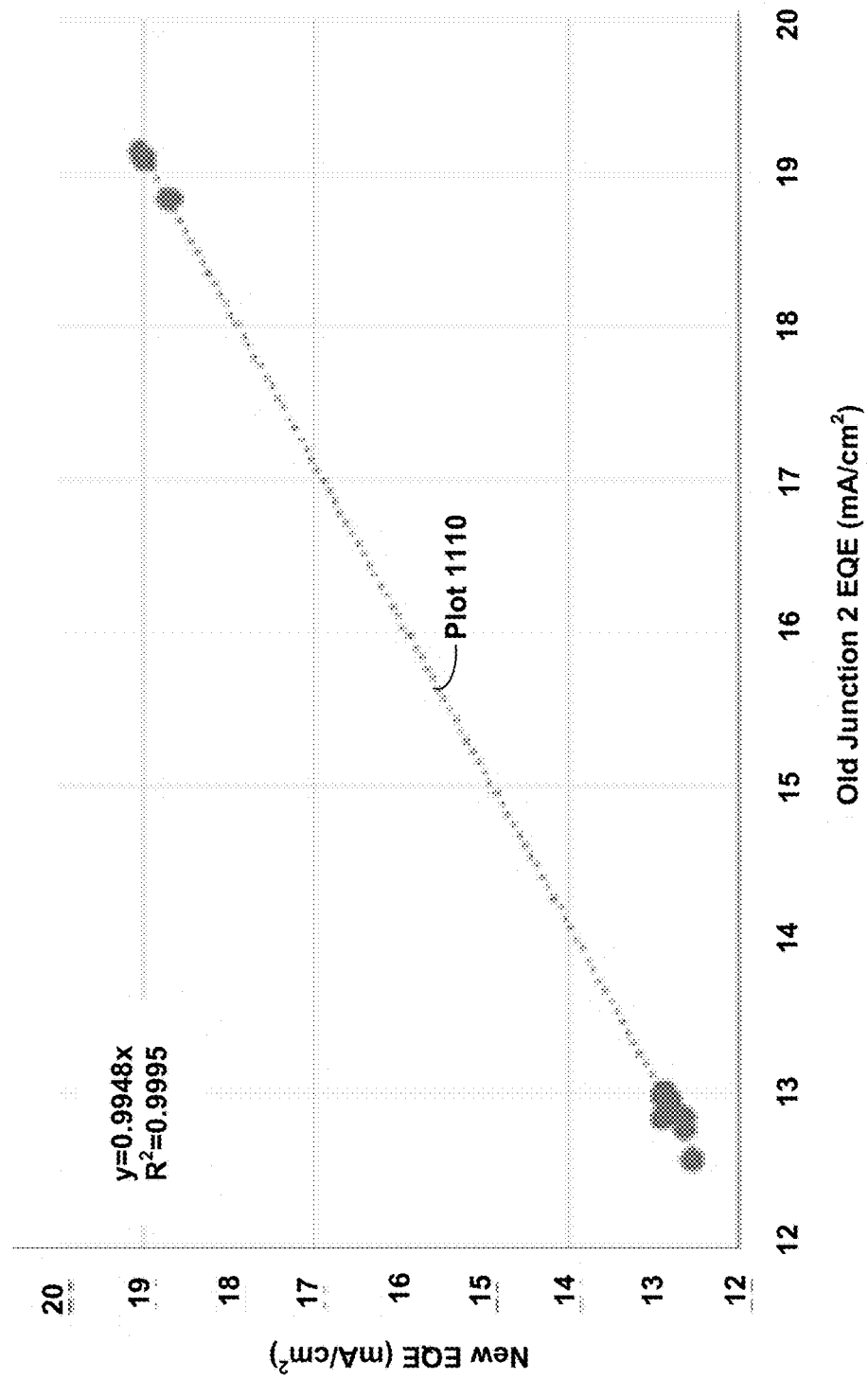
FIG. 11 shows a graph comparing the external quantum efficiencies determined by the two techniques whose external quantum efficiencies were plotted in FIG. 9, according to an example embodiment.

FIG. 11 shows graph 1100 including plot 1110 comparing data of respective plots 930 and 940 of external quantum efficiencies determined for the second junction of the three-junction multijunction photovoltaic device discussed above in the context of FIG. 9, according to an example embodiment. Graph 1100 also shows that data of respective plots 930 and 940 have an $R^2$ value of 0.9995, indicating near equivalence of measurement quality between the prior art algorithm used to generate the data for plot 930 and method 400 used to generate the data for plot 940.

Figure 12:
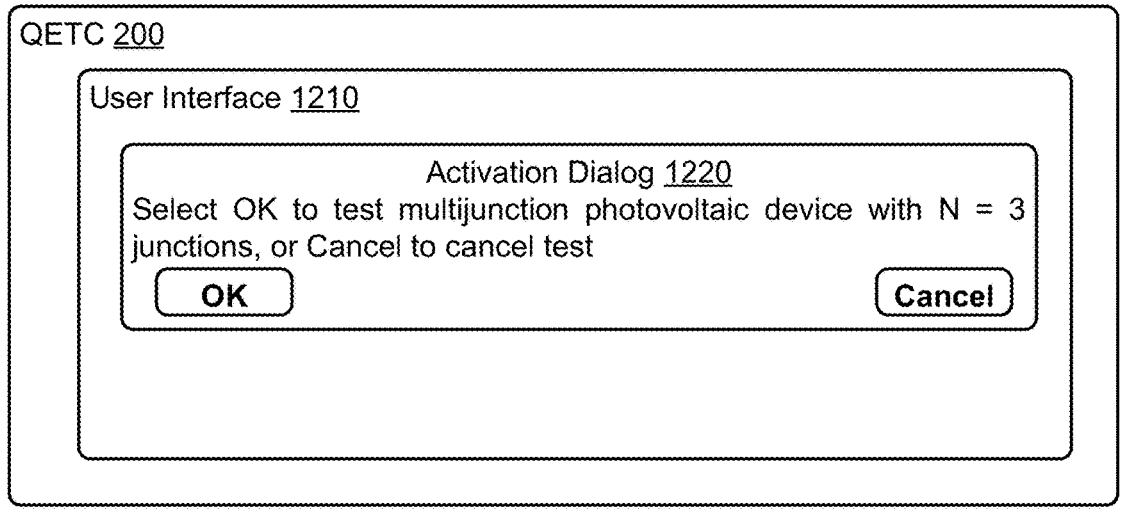
FIGS. 12, 13, and 14 collectively illustrate a scenario where a quantum efficiency test controller executes a technique that uses the method of FIG. 4 while providing a related user interface, according to an example embodiment.
Figure 13:
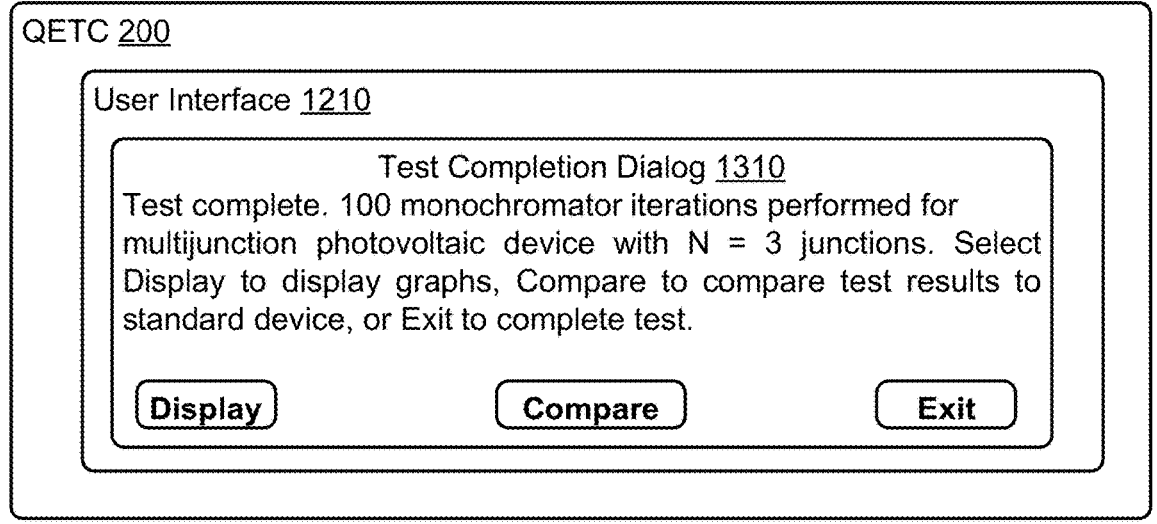
Figure 14:
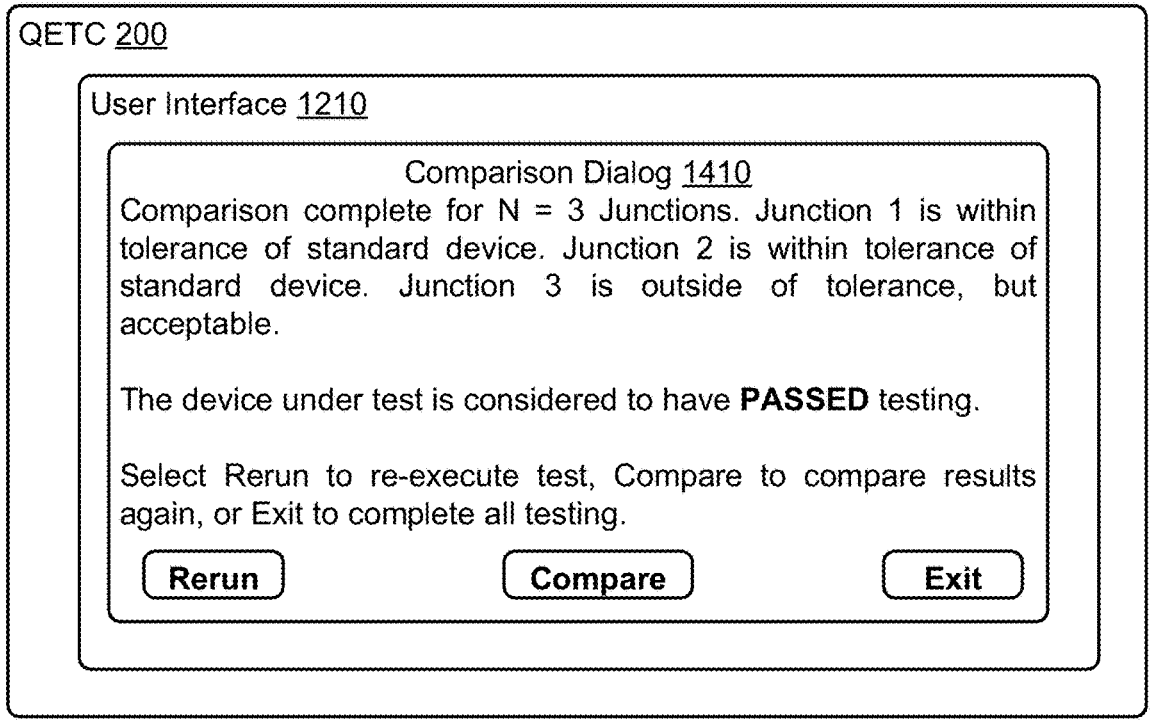

FIGS. 12, 13, and 14 collectively illustrate scenario 1200 where quantum efficiency test controller 200 executes a technique that includes execution of method 400 while providing user interface 1210, according to an example embodiment. In scenario 1200, user interface 1210 of quantum efficiency test controller 200 is used to control execution of method 400 to determine quantum efficiency spectra for a device under test having a three-junction multijunction photovoltaic device DUT3.

As show in FIG. 12, scenario 1200 begins with user interface 1210 providing activation dialog 1220 to initiate testing of DUT3, which requests that a user of quantum efficiency test controller 200 (e.g., a tester of DUT3) either select "OK [button] to test multijunction photovoltaic device with N=3 junctions" or select "Cancel [button] to cancel test". That is, the user can initiate testing of DUT3 by selecting (e.g., clicking on or pressing) the OK button illustrated at left of activation dialog 1220, or can cancel testing of DUT3 by selecting the Cancel button illustrated at right of activation dialog 1220.

In scenario 1200, the user selects the OK button at left of activation dialog 1220, and quantum efficiency test controller 200 executes a technique that uses method 400 to initiate testing of DUT3. As indicated above, method 400 involves only one scan of a grating monochromator to test a device. During scenario 1200, no user interaction is required while DUT3 is tested after the OK button is selected; i.e., user interface 1210 enables one-click quantum efficiency testing of a device under test that includes a multijunction photovoltaic device.

Once testing of DUT3 is completed, scenario 1200 proceeds with user interface 1210 providing test completion dialog 1310. FIG. 13 shows that test completion dialog 1310 informs the user that the "[t]est" is "complete", where the test involved "100 monochromator iterations" being "performed for multijunction photovoltaic device [DUT3] with N=3 junctions".

Test completion dialog 1310 also provides the user with three choices for post-test processing. As a first choice, a user can select a "Display" button shown at left of test completion dialog 1310 to "display graphs" such as a graph similar to graph 900 of showing quantum efficiency data (e.g., quantum efficiency data stored in test results 220) for the three junctions of DUT3, a graph of reflectance data (e.g., reflectance data stored in test results 220) for DUT3, and/or one or more other graphs related to testing of DUT3. In some examples, numerical data underlying a graph can be displayed along with (or instead of) the graph.

As a second choice, the user can select the "Compare" button at center of test completion dialog 1310 to perform a comparison of quantum efficiency data for the three junctions of DUT3 (and perhaps reflectance data for DUT3) with other, related data. In scenario 1200, selection of the "Compare" button of test completion dialog 1310 leads to comparison of quantum efficiency data for the three junctions of DUT3 with quantum efficiency data for a reference three-junction multijunction photovoltaic device. As a third choice, the user can select the "Exit" button at right of test completion dialog 1310 to exit the test without further output. In scenario 1200, selection of any of the buttons of test completion dialog 1310, including the "Exit" button, causes quantum efficiency test controller 200 to store test results 220 to persistent storage for later use; e.g., graph generation, visual review, transmission to other computing devices, etc.

Scenario 1200 proceeds with the user selecting "Compare" button of test completion dialog 1310, causing quantum efficiency test controller 200 to compare quantum efficiency data for the three junctions of DUT3 with quantum efficiency data for a reference three junction multijunction photovoltaic device, and then display comparison dialog 1410.

FIG. 14 shows that display comparison dialog 1410 states that the "[c]omparison [is] complete for N=3 junctions." The comparison of the quantum efficiency data for DUT3 with the quantum efficiency data of the reference device indicates that "Junction 1 is within tolerance of standard device. Junction 2 is within tolerance of standard device. Junction 3 is outside of tolerance, but acceptable" as also shown in FIG. 14. As a conclusion of the comparison of DUT3's quantum efficiency data with the quantum efficiency data of the reference device, quantum efficiency test controller 200 indicates that DUT3 "PASSED" testing using display comparison dialog 1410.

Display comparison dialog 1410 also includes a "Rerun" button at left, a "Compare" button at center, and an "Exit" button at right. The Rerun button can be selected to direct quantum efficiency test controller 200 to "re-execute" or "re-rerun" the technique that includes method 400 for DUT3. In some examples, DUT3 can be removed and a new device under test can be added for testing before the "Rerun" button is selected, causing quantum efficiency test controller 200 to use test equipment (e.g., test equipment 310) to test the new device under test. The Compare button can direct quantum efficiency test controller 200 to perform another comparison between the quantum efficiency data for the three junctions of DUT3 with quantum efficiency data for the reference three-junction multijunction photovoltaic device. The Exit button can direct quantum efficiency test controller 200 to "complete all testing" and close user interface 1210.

In other scenarios, other comparisons are possible as well. In still other scenarios, a comparison between obtained quantum efficiency and/or reflectance data can be performed without additional user input; e.g., the comparison(s) can occur without user input, such as occurring without pressing the "Compare" button of test completion dialog 1310—then, test completion dialog 1310 can further include test comparison results, such as shown in comparison dialog 1410.

Disclosed embodiments are described above with reference to the accompanying drawings, in which some, but not all of the disclosed embodiments may be shown. Indeed, several different embodiments may be described and should not be construed as limited to the embodiments set forth herein. Rather, these embodiments are described so that this disclosure are thorough and complete and convey the disclosure at least to those skilled in the art.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent from the foregoing descriptions. Such modifications and variations are intended to fall within the scope of the appended claims.

In addition, each block in the disclosed flowcharts may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

While various aspects and embodiments have been disclosed herein, other aspects and embodiments will be apparent to those skilled in the art.

What is claimed is:

1. A method, comprising:
performing one or more test iterations to obtain test results related to a quantum efficiency of a multijunction photovoltaic device using a quantum efficiency test controller, the multijunction photovoltaic device comprising a number N of photovoltaic junctions, the number N being greater than one, wherein the quantum efficiency test controller is associated with a number N of bias light sources as well, and wherein a test iteration comprises the quantum efficiency test controller:
  activating a grating monochromator to emit a first test probe of monochromatic light at a first wavelength, and
  while the grating monochromator is emitting the first test probe of monochromatic light, iterating through the number N of bias light sources to activate each of the number N of bias light sources to emit a corresponding bias band of wavelengths of light focused onto the multijunction photovoltaic device so as to activate a corresponding one of the number N of photovoltaic junctions in sequence; and after performing the one or more test iterations, generating an output of the quantum efficiency test controller, the output based on the test results related to the quantum efficiency of the multijunction photovoltaic device.

2. The method of claim 1, wherein activating the grating monochromator to emit the first test probe of monochromatic light comprises activating the grating monochromator to emit the first test probe of monochromatic light having a resolution of 25 nanometers or less.

3. The method of claim 1, wherein iterating through the number N of bias light sources to activate each of the number N of bias light sources to emit the corresponding bias band of wavelengths of light comprises activating one or more light emitting diodes (LEDs).

4. The method of claim 3, wherein the number N of bias light sources comprise a number N of LEDs, and wherein activating the one or more LEDs comprises:
   activating the number N of LEDs in sequence to emit the number N bias bands of wavelengths of light.

5. The method of claim 1, wherein iterating through the number N of bias light sources to activate each of the number N of bias light sources to emit a corresponding bias band of wavelengths of light comprises:
   while the grating monochromator is emitting the first test probe of monochromatic light, measuring a quantum efficiency value for each of the number N of photovoltaic junctions; and
   recording the number N of measured quantum efficiency values as part of the test results.

6. The method of claim 5, wherein measuring the quantum efficiency value for each of the number N of photovoltaic junctions comprises:
   repeating, for each photovoltaic junction of the number N of photovoltaic junctions:
      measuring a current generated by the photovoltaic junction while first test probe of monochromatic light and a bias band of wavelengths of light associated with the photovoltaic junction are being emitted; and
      determining a quantum efficiency value of the photovoltaic junction based on the measured current.

7. The method of claim 1, wherein performing one or more test iterations further comprises performing a second test iteration that includes:
   activating the grating monochromator to emit a second test probe of monochromatic light at a second wavelength, wherein the second wavelength differs from the first wavelength by at least a resolution of the monochromator is emitting the first test probe of monochromatic light; and
   while the grating monochromator is emitting the second test probe of monochromatic light, iterating through the number N of bias light sources to activate each of the number N of bias light sources to emit a corresponding bias band of wavelengths of light.

8. The method of claim 1, wherein performing the one or more test iterations to obtain test results related to the quantum efficiency of the multijunction photovoltaic device comprises performing the one or more test iterations to obtain test results related to the quantum efficiency of component of a solar cell, a laser power converter, and/or a thermal photovoltaic cell.

9. The method of claim 1, wherein performing the one or more test iterations comprises the one or more test iterations collectively causing the grating monochromator to make a single scan through a plurality of wavelengths of light.

10. The method of claim 9, wherein generating the output based on the test results related to the quantum efficiency of the multijunction photovoltaic device comprises generating a graph of quantum efficiencies of the multijunction photovoltaic device over the plurality of wavelengths of light.

11. A system, comprising:
   a grating monochromator;
   a number N of light sources, the number N being greater than zero one; and
   a quantum efficiency test controller, the quantum efficiency test controller comprising one or more processors and one or more non-transitory computer readable media configured to store at least computer-readable instructions that, when executed by the one or more processors, cause the quantum efficiency test controller to perform functions comprising:
      performing one or more test iterations to obtain test results related to a quantum efficiency of a multijunction photovoltaic device, the multijunction photovoltaic device comprising a number N of photovoltaic junctions, wherein a test iteration comprises:
         activating the grating monochromator to emit a first test probe of monochromatic light at a first wavelength; and
         while the grating monochromator is emitting the first test probe of monochromatic light, iterating through the number N of bias light sources to activate each of the number N of bias light sources to emit a corresponding bias band of wavelengths of light focused onto the multijunction photovoltaic device so as to activate a corresponding one of the number N of photovoltaic junctions in sequence;
      after performing the one or more test iterations, generating an output that is based on the test results related to the quantum efficiency of the multijunction photovoltaic device.

12. The system of claim 11, further comprising:
   a light source configured to provide a broadband white light to the grating monochromator;
   an optical chopper configured to interrupt light emitted by the grating monochromator; and
   a lock-in amplifier configured to filter a response of the multijunction photovoltaic device to at least one bias band of wavelengths of light.

13. The system of claim 11, wherein the plurality of light sources comprises one or more light emitting diodes (LEDs).

14. The system of claim 11, wherein the number N of photovoltaic junctions comprises a first photovoltaic junction and a second photovoltaic junction, and wherein iterating through the number N of bias light sources to activate each of the number N of bias light sources to emit a corresponding bias band of wavelengths of light comprises:
   while the grating monochromator is emitting the first test probe of monochromatic light, measuring a quantum efficiency value for each of the number N of photovoltaic junctions; and
   recording the number N of measured quantum efficiency values as part of the test results.

15. The system of claim 14, wherein measuring the quantum efficiency value for each of the number N of photovoltaic junctions comprises:
   repeating, for each photovoltaic junction of the number N of photovoltaic junctions:
      measuring a current generated by the photovoltaic junction while first test probe of monochromatic light and a bias band of wavelengths of light associated with the photovoltaic junction are being emitted; and determining a quantum efficiency value of the photovoltaic junction based on the measured current.

16. The system of claim 11, wherein performing one or more test iterations further comprises performing a second test iteration that includes:

activating the grating monochromator to emit a second test probe of monochromatic light at a second wavelength, wherein the second wavelength differs from the first wavelength by at least a resolution of the monochromator is emitting the first test probe of monochromatic light; and while the grating monochromator is emitting the second test probe of monochromatic light, iterating through the number N of bias light sources to activate each of the number N of bias light sources to emit a corresponding bias band of wavelengths of light.

17. The system of claim 11, wherein the multijunction photovoltaic device is a component of a solar cell, a laser power converter, and/or a thermal photovoltaic cell.

18. The system of claim 11, wherein performing the one or more test iterations comprises the one or more test iterations collectively causing the grating monochromator to make a single scan through a plurality of wavelengths of light.

19. The system of claim 18, wherein generating the output based on the test results related to the quantum efficiency of the multijunction photovoltaic device comprises generating a graph of quantum efficiencies of the multijunction photovoltaic device over the plurality of wavelengths of light.

20. A non-transitory computer readable medium having stored thereon computer-readable instructions, that when executed by one or more processors of a quantum efficiency test controller, cause the quantum efficiency test controller to perform functions comprising:

performing one or more test iterations to obtain test results related to a quantum efficiency of a multijunction photovoltaic device, the multijunction photovoltaic device comprising a number N of photovoltaic junctions, the number N being greater than one, wherein the quantum efficiency test controller is associated with the number N of bias light sources as well, and wherein a test iteration comprises:

activating a grating monochromator to emit a first test probe of monochromatic light at a first wavelength, and while the grating monochromator is emitting the first test probe of monochromatic light, iterating through the number N of bias light sources to activate each of the number N of bias light sources to emit a corresponding bias band of wavelengths of light focused onto the multijunction photovoltaic device so as to activate a corresponding one of the number N of photovoltaic junctions in sequence; and after performing the one or more test iterations, generating an output that is based on the test results related to the quantum efficiency of the multijunction photovoltaic device.

* * * * *